(12) United States Patent
Hirakawa et al.

(10) Patent No.: US 9,919,509 B2
(45) Date of Patent: Mar. 20, 2018

(54) PEELING DEVICE, PEELING SYSTEM AND PEELING METHOD

(75) Inventors: Osamu Hirakawa, Koshi (JP); Naoto Yoshitaka, Koshi (JP); Masaru Honda, Koshi (JP); Xavier Francois Brun, Chandler, AZ (US); Charles Wayne Singleton, Jr., Chandler, AZ (US)

(73) Assignees: TOKYO ELECTRON LIMITED, Tokyo (JP); INTEL CORPORATION, Santa Clara, CA (US)

(*) Notice: Subject to any disclaimer, the term of this patent is extended or adjusted under 35 U.S.C. 154(b) by 365 days.

(21) Appl. No.: 13/977,134

(22) PCT Filed: Dec. 16, 2011

(86) PCT No.: PCT/JP2011/079187
§ 371 (c)(1),
(2), (4) Date: Jun. 28, 2013

(87) PCT Pub. No.: WO2012/093574
PCT Pub. Date: Jul. 12, 2012

(65) Prior Publication Data
US 2013/0269879 A1    Oct. 17, 2013

(30) Foreign Application Priority Data
Jan. 7, 2011    (JP) .................................. 2011-002560

(51) Int. Cl.
*B32B 43/00* (2006.01)
*H01L 21/67* (2006.01)
(Continued)

(52) U.S. Cl.
CPC ............ *B32B 43/006* (2013.01); *B32B 38/10* (2013.01); *H01L 21/67051* (2013.01);
(Continued)

(58) Field of Classification Search
CPC . H01L 2221/68381; H01L 2221/68386; B32B 43/006; Y10T 156/1126;
(Continued)

(56) References Cited

U.S. PATENT DOCUMENTS 5,447,596 A * 9/1995 Hayase .................. 156/750
6,067,727 A * 5/2000 Muraoka .................. 34/317
(Continued)

FOREIGN PATENT DOCUMENTS

| JP | 9-167724 A | 6/1997 |
| JP | 2004-063645 A | 2/2004 |
| JP | 2010-016125 A | 1/2010 |

*Primary Examiner* — Mark A Osele
(74) *Attorney, Agent, or Firm* — Nath, Goldberg & Meyer; Jerald L. Meyer

(57) ABSTRACT

A peeling device for peeling off a substrate to be processed and a support substrate from an overlapped substrate, the overlapped substrate being formed by bonding the substrate to be processed and the support substrate by an adhesive, which includes: a first holding unit configured to heat the substrate to be processed and configured to hold the substrate to be processed; a second holding unit configured to heat the support substrate and configured to hold the support substrate; a moving mechanism configured to horizontally move at least one of the first holding unit and the second holding unit relative to each other; and an inert gas supply mechanism configured to supply an inert gas onto a bonding surface of the substrate to be processed or a bonding surface of the support substrate.

17 Claims, 13 Drawing Sheets

(51) Int. Cl.
*H01L 21/687* (2006.01)
*B32B 38/10* (2006.01)
B32B 37/06 (2006.01)
B32B 41/00 (2006.01)

(52) U.S. Cl.
CPC .. *H01L 21/67092* (2013.01); *H01L 21/67103* (2013.01); *H01L 21/68728* (2013.01); *B32B 37/06* (2013.01); *B32B 41/00* (2013.01); *B32B 2309/68* (2013.01); *B32B 2310/0472* (2013.01); *B32B 2457/14* (2013.01); *H01L 2221/68381* (2013.01); *Y10S 156/93* (2013.01); *Y10S 156/941* (2013.01); *Y10T 156/1126* (2015.01); *Y10T 156/1137* (2015.01); *Y10T 156/1153* (2015.01); *Y10T 156/1189* (2015.01); *Y10T 156/1911* (2015.01); *Y10T 156/1939* (2015.01); *Y10T 156/1972* (2015.01)

(58) Field of Classification Search
CPC ......... Y10T 156/1137; Y10T 156/1153; Y10T 156/1189; Y10T 156/1911; Y10T 156/1972; Y10T 156/1939; Y10S 156/93; Y10S 156/941
See application file for complete search history.

(56) References Cited

U.S. PATENT DOCUMENTS

| | | | | |
|---|---|---|---|---|
| 7,211,168 | B2* | 5/2007 | Miyanari | 156/701 |
| 7,223,319 | B2* | 5/2007 | Kurosawa et al. | 156/716 |
| 7,406,759 | B2* | 8/2008 | Yamamoto et al. | 29/559 |
| 7,708,854 | B2* | 5/2010 | Kroninger et al. | 156/247 |
| 2010/0000680 | A1* | 1/2010 | Inao et al. | 156/344 |

* cited by examiner

PEELING DEVICE, PEELING SYSTEM AND PEELING METHOD

CROSS-REFERENCE TO RELATED APPLICATIONS

This application is a 35 U.S.C §371 national stage filling of International Application No. PCT/JP2011/079187, filed Dec. 16, 2011, the entire contents of which are incorporated by reference herein, which claims priority to Japanese Patent Application No. 2011-002560, filed on Jan. 7, 2011, the entire contents of which are incorporated by reference herein.

TECHNICAL FIELD

The present disclosure relates to a peeling device which peels off a substrate to be processed and a support substrate from an overlapped substrate, a peeling system including the peeling device, and a peeling method using the peeling device.

BACKGROUND

In recent years, for example, the diameter of semiconductor wafers (hereinafter, referred to as "wafers") are increasing. In addition, there is a desire to make the wafers thin in a specified process such as mounting or the like. However, a large-diameter thin wafer is likely to be bent or cracked if the wafer is transferred or polished as is. As such, for example, in order to reinforce the wafer, the wafer is bonded to, for example, a wafer or a glass substrate that acts as a support substrate. Thereafter, a predetermined process such as a polishing process is performed on the wafer in a state where the wafer is bonded to the support substrate as described above, and subsequently, the wafer and the support substrate are peeled off from each other.

Such a peeling process is performed, for example, using a peeling apparatus. For example, Patent Document 1 discloses a peeling device which can be used which directly bonds a wafer with devices formed thereon to a wafer with a thermal oxide film formed thereon, followed by performing a peeling process on the bonded wafer. The peeling device includes a first holder for holding the wafer, a second holder for holding the support substrate, and a nozzle for injecting liquid between the wafer and the support substrate. In the peeling device, the nozzle injects liquid between the wafer and the support substrate which are bonded together, i.e., a bonding surface between the wafer and the support substrate, at an injection pressure which is greater than a bonding strength applied in bonding the wafer and the support substrate, preferably, at an injection pressure that is two or more times stronger than the bonding strength, thus peeling the wafer and the support.

In addition to the method of directly bonding the wafer to a support substrate with the thermal oxide film formed thereon, there is a method of bonding the wafer and the support substrate, a method of bonding a support substrate and a wafer by applying an adhesive therebetween.

If the adhesive is used for the bonding, when the wafer and the support substrate are peeled off from each other, the adhesive applied between the wafer and the support substrate needs to be softened. For this reason, when the wafer and the support substrate are peeled off, heating is applied to the bonded wafer to soften the adhesive.

However, when the wafer is heated, oxidation is rapidly progressed on a surface (bonding surface) of the bonded wafer exposed by the peeling. Such a rapid oxidation may cause a serious damage to a product.

Prevention of such damage to the product from the rapid oxidation requires decreasing a concentration of oxygen around the wafer when the peeling is performed. However, in order to decrease oxygen concentration to prevent the rapid oxidation, it is necessary to cover the wafer and the peeling device with an airtight container. This causes an increase in size of the apparatus, which results in an increased installation space, an increased installation cost, and a reduction in throughput.

As a method of preventing the rapid oxidation of the wafer without using the airtight container, there is a method which directly injects an inert gas or the like to the wafer after the peeling, for example using a slit-shaped nozzle. However, when the inert gas is injected to the wafer by the slit-like nozzle, a flow rate of the inert gas injected from the nozzle causes circumambient air to be sucked into the peeling device. However, due to the air approaching the bonding surface of the wafer along with the inert gas, the inert gas cannot be injected to the bonding surface of the wafer.

SUMMARY

The present disclosure has been made in consideration of the above points, and some embodiments use a heat treatment to efficiently prevent a rapid oxidation from being generated on a bonding surface between a substrate to be processed and a support substrate when the substrates are peeled off from each other.

One embodiment of the present disclosure is a peeling device for peeling off a substrate to be processed and a support substrate from an overlapped substrate, the overlapped substrate being formed by bonding the substrate to be processed and the support substrate by an adhesive, the peeling device includes: a first holding unit provided with a heating mechanism to heat the substrate to be processed and configured to hold the substrate to be processed; a second holding unit provided with a heating mechanism to heat the support substrate and configured to hold the support substrate; a moving mechanism configured to move at least one of the first holding unit and the second holding unit relative to each other in a horizontal direction; and an inert gas supply mechanism configured to supply an inert gas onto a bonding surface of the substrate to be processed or a bonding surface of the support substrate, wherein the inert gas supply mechanism includes a porous portion with a plurality of holes formed therein and a gas supply pipe connected to the porous portion to supply the inert gas to the porous portion, and wherein the porous portion is provided to be vertically spaced apart from the bonding surface of the substrate to be processed by a predetermined distance.

According to the peeling device of the present disclosure, since there are provided the moving mechanism for moving the first holding unit or the second holding unit relative to each other in the horizontal direction and the inert gas supply mechanism with the porous portion connected to the gas supply pipe, wherein the porous portion is disposed to be vertically spaced apart from the bonding surface of the substrate to be processed and the support substrate by the predetermined distance, it is possible to separate the substrate to be processed held by the first holding unit and the support substrate held by the second holding unit from the overlapped wafer by moving the moving mechanism the second holding unit in, e.g., the horizontal direction. Further, it is possible to supply the inert gas from the porous portion toward the bonding surface of the substrate to be processed exposed by the peeling. In this case, since the inert gas is supplied through the porous portion with the plurality of holes formed therein, a flow rate of the supplied inert gas is controlled. With this configuration, since only the inert gas is supplied onto the bonding surface of the wafer to be processed W without introducing a circumambient air during the supply of the inert gas, it is possible to maintain the exposed bonding surface of the substrate to be processed in the inert gas atmosphere. With this configuration, for example, in order to prevent the bonding surface of the heated substrate to be processed from being oxidized, it is not necessary to establish an ambitious measure to cover the substrate to be processed with an airtight container. Thus, according to the present disclosure, it is possible to efficiently prevent rapid progress of oxidation on the bonding surfaces of the substrates, which is generated when the substrate to be processed and the support substrate that are subjected to heat processing are peeled off from each other.

The present disclosure according to another aspect is a peeling system for peeling off a substrate to be processed and a support substrate from an overlapped substrate, the overlapped substrate being formed by bonding the substrate to be processed and the support substrate by an adhesive, the peeling system includes: a peeling process station configured to perform a predetermined process on the substrate to be processed, the support substrate and the overlapped substrate; a carry-in/carry-out station configured to carry the substrate to be processed, the support substrate or the overlapped substrate in and out of the peeling process station; and a transfer station configured to transfer the substrate to be processed, the support substrate or the overlapped substrate between the peeling process station and the carry-in/carry-out station, wherein the peeling process station includes: a peeling device configured to peel off the substrate to be processed and the support substrate from the overlapped substrate; a first cleaning device configured to clean the substrate to be processed which is peeled by the peeling device; a second cleaning device configured to clean the support substrate which is peeled by the peeling device; and wherein the peeling device includes: a first holding unit provided with a heating mechanism to heat the substrate to be processed and configured to hold the substrate to be processed; a second holding unit provided with a heating mechanism to heat the support substrate and configured to hold the support substrate; a moving mechanism configured to move at least one of the first holding unit and the second holding unit relative to each other in a horizontal direction; and an inert gas supply mechanism configured to supply an inert gas onto a bonding surface of the substrate to be processed which is exposed by moving the first holding unit and the second holding unit relative to each other in the horizontal direction by the moving mechanism, wherein the inert gas supply mechanism includes a porous portion with a plurality of holes formed therein and a gas supply pipe connected to the porous portion to supply the inert gas to the porous portion, and wherein the porous portion is provided to be vertically spaced apart from the bonding surface of the substrate to be processed by a predetermined distance.

Further, the present disclosure according to still another aspect is a method for peeling off a substrate to be processed and a support substrate from an overlapped substrate using a peeling device, the overlapped substrate being formed by bonding the substrate to be processed and the support substrate by an adhesive, wherein the peeling device includes: a first holding unit provided with a heating mechanism to heat the substrate to be processed and configured to hold the substrate to be processed; a second holding unit provided with a heating mechanism to heat the support substrate and configured to hold the support substrate; a moving mechanism configured to move at least one of the first holding unit and the second holding unit relative to each other in a horizontal direction; and an inert gas supply mechanism configured to supply an inert gas onto the substrate to be processed, wherein the inert gas supply mechanism includes a porous portion with a plurality of holes formed therein and a gas supply pipe connected to the porous portion to supply the inert gas to the porous portion, and wherein the porous portion is provided to be vertically spaced apart from the bonding surface of the substrate to be processed by a predetermined distance, the method includes: peeling off the substrate to be processed and the support substrate from the overlapped wafer by moving the first holding unit and the second holding unit relative to each other in the horizontal direction while heating the substrate to be processed held by the first holding unit and the support substrate held by the second holding unit; and spacing the porous portion apart from a bonding surface of the substrate to be processed by a predetermined distance in a vertical direction, and supplying the inert gas from the porous portion to the bonding surface of the substrate to be processed exposed by the peeling.

Further, the present disclosure according to still another aspect is a computer readable storage medium having a control program operating on a computer stored thereon, wherein the control program, when executed, causes the computer to perform a method of peeling off a substrate to be processed and a support substrate from an overlapped substrate using a peeling device, the overlapped substrate being formed by bonding the substrate to be processed and the support substrate by an adhesive, wherein the peeling device includes: a first holding unit provided with a heating mechanism to heat the substrate to be processed and configured to hold the substrate to be processed; a second holding unit provided with a heating mechanism to heat the support substrate and configured to hold the support substrate; a moving mechanism configured to move at least one of the first holding unit and the second holding unit relative to each other in a horizontal direction; and an inert gas supply mechanism configured to supply an inert gas onto the substrate to be processed, wherein the inert gas supply mechanism includes a porous portion with a plurality of holes formed therein and a gas supply pipe connected to the porous portion to supply the inert gas to the porous portion, and wherein the porous portion is provided to be vertically spaced apart from the bonding surface of the substrate to be processed by a predetermined distance, wherein the method includes: peeling off the substrate to be processed and the support substrate from the overlapped wafer by moving the first holding unit and the second holding unit relative to each other in the horizontal direction while heating the substrate to be processed held by the first holding unit and the support substrate held by the second holding unit; and spacing the porous portion apart from a bonding surface of the substrate to be processed by a predetermined distance in a vertical direction, and supplying the inert gas from the porous portion to the bonding surface of the substrate to be processed exposed by the peeling.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
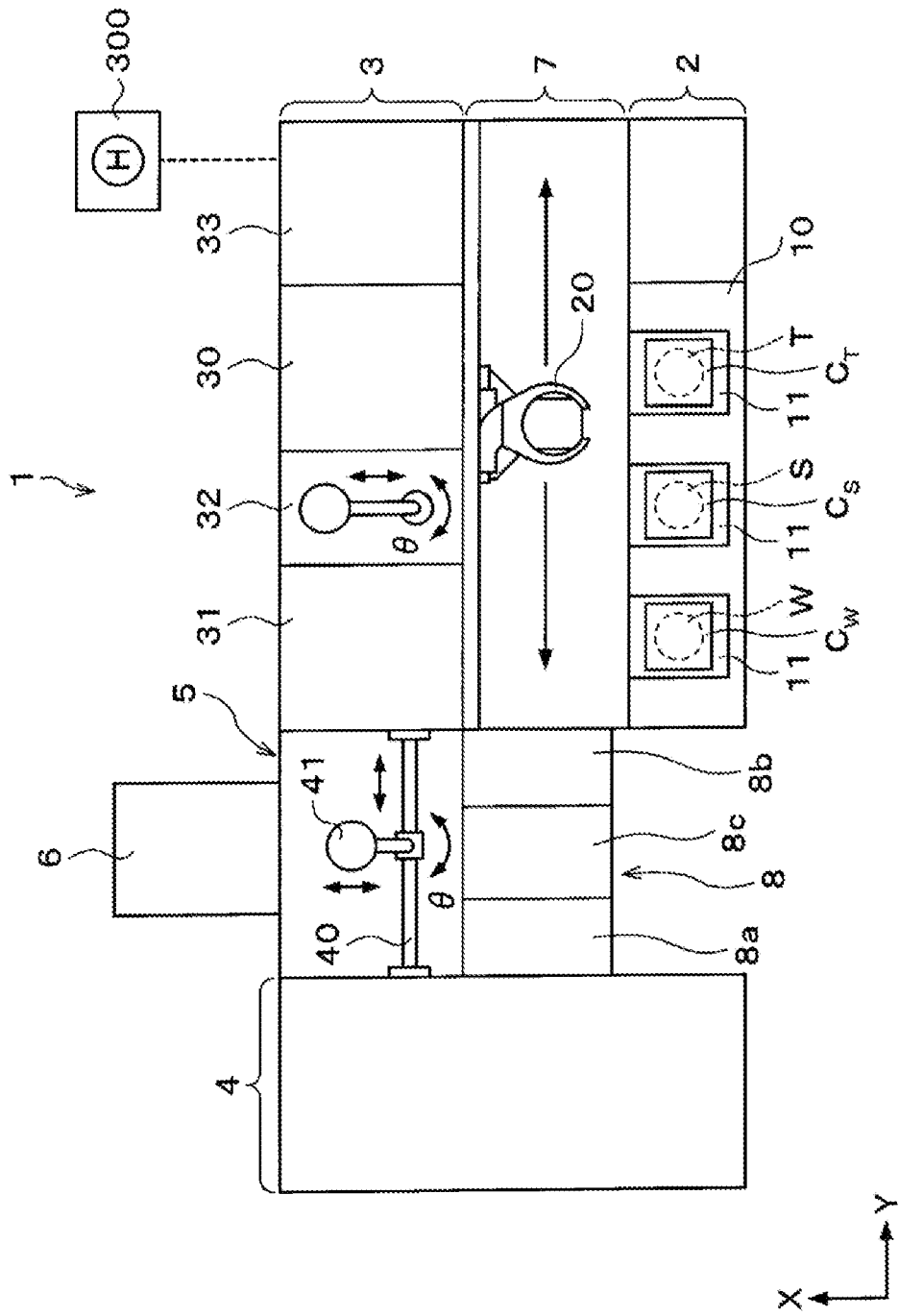
FIG. 1 is a plane view schematically showing a configuration of a peeling system according to an embodiment of the present disclosure.

Hereinafter, embodiments of the present disclosure will be described. FIG. 1 is a plane view schematically showing a configuration of a peeling system 1 including a peeling device according to one embodiment.

Figure 2:
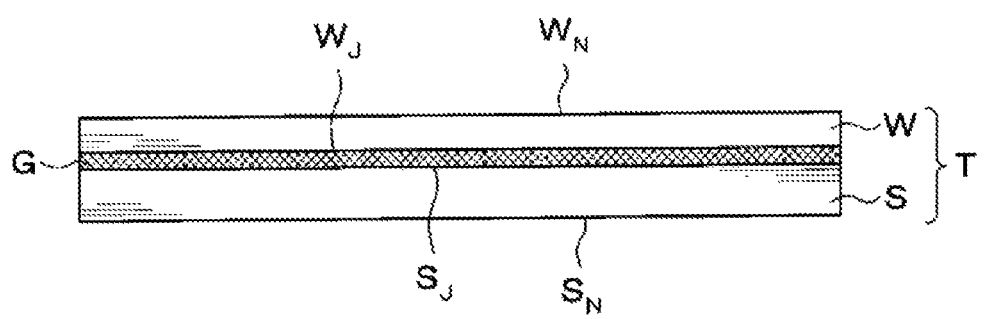
FIG. 2 is a lateral view of a wafer to be processed and a support wafer.

In the peeling system 1, an overlapped wafer T as an overlapped substrate, which is formed by bonding a wafer to be processed W as a substrate to be processed and a support wafer S as a support substrate using an adhesive G as shown in FIG. 2, is separated into the wafer to be processed W and the support wafer S. Hereinafter, in the wafer to be processed W, a surface to be bonded to the support wafer S through the adhesive G will be referred to as a "bonding surface $W_J$," and an opposite surface of the bonding surface $W_J$ will be referred to as a "non-bonding surface $W_N$." Similarly, in the support wafer S, a surface to be bonded to the wafer to be processed W through the adhesive G will be referred to as a "bonding surface $S_J$," and an opposite surface of the bonding surface $S_J$ will be referred to as a "non-bonding surface $S_N$." In addition, the wafer to be processed W is a wafer to be used as a product. A plurality of electronic circuits are formed on, e.g., the bonding surface $W_J$ of the wafer to be processed W. Further, for example, the non-bonding surface $W_N$ of the wafer to be processed W is subjected to a polishing in order to thin a thickness thereof (by, e.g., 50 µm). The support wafer S has the same diameter as that of the wafer to be processed W and supports the wafer to be processed W. While in this embodiment, the wafer has been described to be used as the support substrate, the present disclosure is not limited thereto. For example, another substrate such as a glass substrate may be used as the support substrate.

As shown in FIG. 1, the peeling system 1 includes a carry-in/carry-out station 2 in which cassettes $C_W$, $C_S$ and $C_T$ are carried in and out between the carry-in/carry-out station 2 and the outside, a peeling process station 3 including various processing units which are configured to perform a predetermined process on the wafers to be processed W, the support wafers S and the overlapped wafers T, an interface station 5 configured to deliver the wafers to be processed W between the peeling process station 3 and a post-treatment station 4 disposed adjacent thereto, and an inspection device 6 configured to inspect the wafers to be processed W before they are delivered to the post-treatment station 4. These stations 2, 3, 4, 5 and 6 are connected serially. The cassettes $C_W$, $C_S$ and $C_T$ are configured to accommodate a plurality of wafers to be processed W, a plurality of support wafers S, and a plurality of overlapped wafers T therein, respectively.

The carry-in/carry-out station 2 and the peeling process station 3 are arranged in a line along an X-axis direction (vertical direction in FIG. 1). A transfer station 7 is provided between the carry-in/carry-out station 2 and the peeling process station 3. The interface station 5 is disposed at the backward side of the peeling process station 3 along a Y-axis direction (at the left side in FIG. 1). In addition, the inspection device 6 is disposed at the forward side of the interface station 5 in the X-axis direction (the upside in FIG. 1). A cleaning device after inspection 8, which is configured to clean the wafers to be processed W after the inspection, is disposed opposite to the inspection device 6 with the interface station 5 interposed therebetween, i.e., at the backward side of the interface station 5 in the X-axis direction.

A cassette loading table 10 is disposed in the carry-in/carry-out station 2. A plurality of, e.g., three, cassette loading plates 11 are disposed in the cassette loading table 10. The cassette loading plates 11 are arranged in a line along the Y-axis direction (the left and right direction in FIG. 1). The cassette loading plates 11 can load thereon the cassettes $C_W$, $C_S$ and $C_T$ when they are carried in and out between the carry-in/carry-out station 2 and the outside of the peeling system 1, respectively. In this way, the carry-in/carry-out station 2 can hold the plurality of wafers to be processed W, the plurality of support wafers S, and the plurality of overlapped wafers T. In addition, the number of the cassette loading plates 11 is not limited to this embodiment but may be selected as appropriate. Further, the plurality of overlapped wafers T loaded in the carry-in/carry-out station 2 are inspected in advance to distinguish them as a normal overlapped wafer including a normal wafer to be processed W and an abnormal overlapped wafer including an abnormal wafer to be processed W.

A first transfer unit 20 is disposed in the wafer transfer region 7. The first transfer unit 20 is equipped with a transfer arm, which is movable in vertical and horizontal directions (the Y and X-axis directions), and is rotatable around the vertical axis. The first transfer unit 20 moves inside the wafer transfer region 7 to transfer the wafer to be processed W, the support wafer S and the overlapped wafer T between the carry-in/carry-out station 2 and the peeling process station 3.

The peeling process station 3 includes a peeling device 30 configured to peel off the wafer to be processed W and the support wafer S from the overlapped wafer T. A first cleaning device 31 configured to clean the wafer to be processed W which has been peeled off, is disposed at the backward side of the peeling device 30 along the Y-axis direction (at the left side in FIG. 1). A second transfer unit 32 as another a transfer unit is provided between the peeling device 30 and the first cleaning device 31. Further, a second cleaning device 33 configured to clean the support wafer S which has been peeled off, is disposed at the forward side of the peeling device 30 in the Y-axis direction (at the right side in FIG. 1). As described above, in the peeling process station 3, the first cleaning device 31, the second transfer unit 32, the peeling device 30, and the second cleaning device 33 are arranged in order away from the interface station 5.

The inspection device 6 inspects whether a residual of the adhesive G exists on the wafer to be processed W which is peeled by the peeling device 30. The cleaning device after inspection 8 cleans the wafer to be processed W which has been determined to have the residual of the adhesive G thereon by the inspection device 6. The cleaning device after inspection 8 has a bonding surface cleaning section 8a for cleaning the bonding surface $W_J$ of the wafer to be processed W, a non-bonding surface cleaning section 8b for cleaning the non-bonding surface $W_N$ of the wafer to be processed W, and a inverting section 8c for inverting the wafer to be processed W upside down.

The interface station 5 is provided with a third transfer unit 41 as another transfer mechanism, which is configured to move along a transfer path 40 extending along the Y-axis direction. The third transfer unit 41, which is movable in a vertical direction and is also rotatable around the vertical axis (or in a θ direction), transfers the wafer to be processed W between the peeling process station 3, the post-treatment station 4, the inspection device 6 and the cleaning device after inspection 8.

Further, the post-treatment station 4 performs a predetermined post-treatment on the wafer to be processed W which is peeled by the peeling process station 3. An example of the predetermined post-treatment may include mounting the wafer to be processed W, inspecting electric properties of the electronic circuits formed on the wafer to be processed W, dicing the wafer to be processed W on a chip-by-chip basis, or the like.

Figure 3:
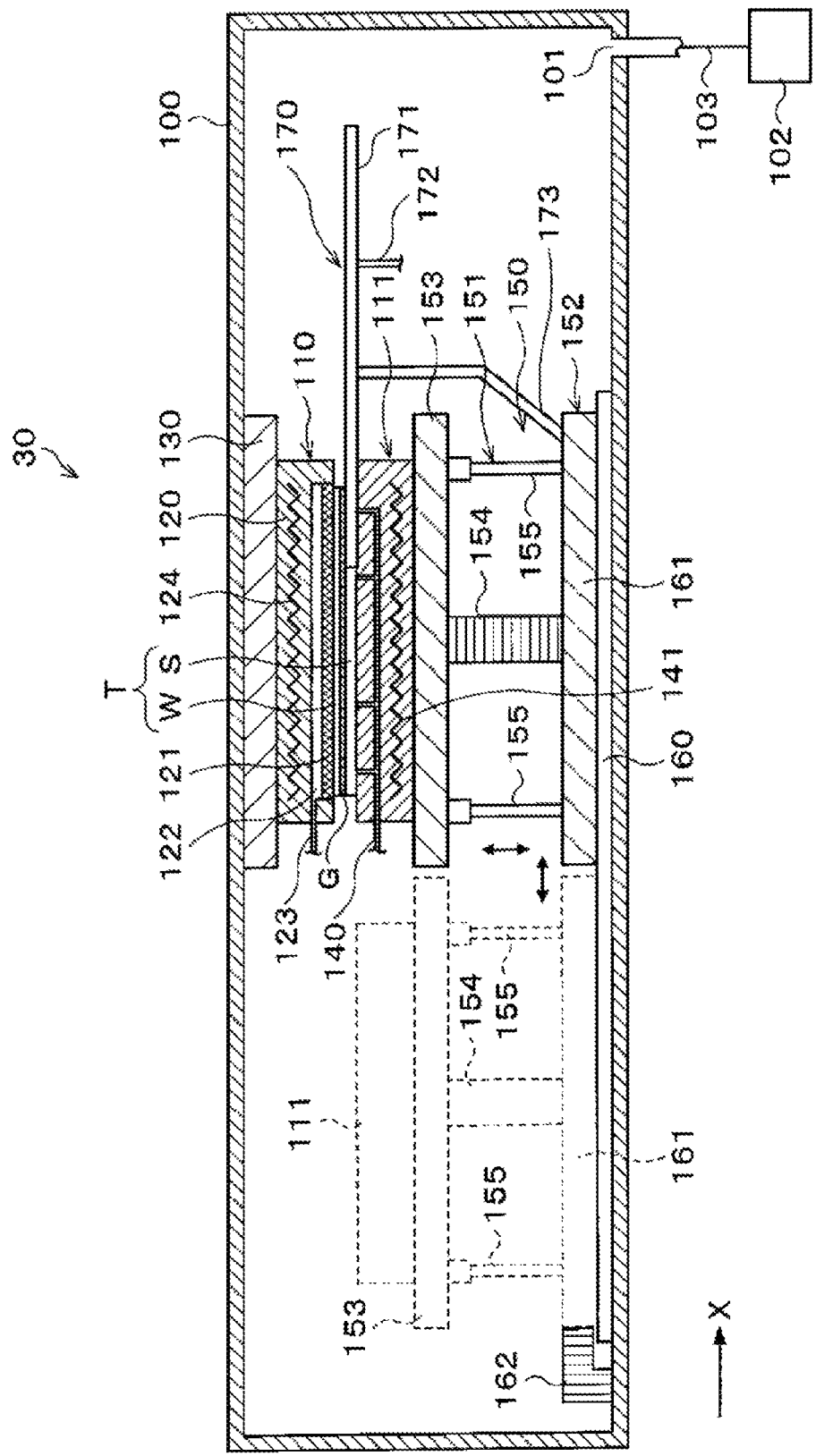
FIG. 3 is longitudinal sectional view schematically showing a configuration of a peeling device.

Next, a configuration of the aforementioned peeling device 30 will be described. As shown in FIG. 3, the peeling device 30 includes a housing 100 in which a plurality of equipments are accommodated. An inlet/outlet (not shown) through which the wafer to be processed W, the support wafer S and the overlapped wafer T are passed, is formed in a lateral side of the housing 100. An opening/closing shutter (not shown) is installed at the inlet/outlet. In addition, the housing 100 of this embodiment is made of, for example, a stainless steel thin plate or the like, which is not an internally-airtight one.

An exhaust port 101 is formed at a bottom of the housing 100 so that the internal atmosphere of the housing 100 is exhausted through the exhaust port 101. An exhaust pipe 103, which is in communication with an exhaust device 102 such as a vacuum pump, is connected to the exhaust port 101.

The housing 100 is provided with a first holding unit 110 configured to adsorb the wafer to be processed W on the bottom surface thereof, and a second holding unit 111 configured to hold the support wafer S on the upper surface thereof. The first holding unit 110 is disposed above the second holding unit 111 while being positioned to face the second holding unit 111. That is, the peeling process is performed on the overlapped wafer T within the housing 100 with the wafer to be processed W disposed on the upper side and the support wafer S disposed on the lower side.

An example of the first holding unit 110 may include a porous chuck. The first holding unit 110 includes a flat plate main body 120. A porous body 121 is formed at a bottom side of the main body 120. The porous body 121 has approximately the same diameter as that of the wafer to be processed W and is in contact with the non-bonding surface $W_N$ of the wafer to be processed W. An example of the porous body 121 may include a silicon carbide.

Further, a suction space 122 is formed inside the main body 120 and above the porous body 121. The suction space 122 is formed to cover, e.g., the porous body 121. The suction space 122 is connected to a suction pipe 123. The suction pipe 123 is connected to a negative pressure generator (not shown), e.g., a vacuum pump. The non-bonding surface $W_N$ of the wafer to be processed is sucked by the suction pipe 123 through the suction space 122 and the porous body 121 so that the wafer to be processed W is adsorbed by the first holding unit 110.

In addition, a heating mechanism 124 configured to heat the wafer to be processed W is installed inside the main body 120 and above the suction space 122. For example, a heater may be used as the heating mechanism 124.

A support plate 130 configured to support the first holding unit 110 is installed on the upper surface of the first holding unit 110. The support plate 130 is supported on a ceiling surface of the housing 100. Alternatively, the support plate 130 of this embodiment may be omitted, and the first holding unit 110 may be supported by being in contact with the ceiling surface of the housing 100.

A suction pipe 140 configured to adsorb the support wafer S is installed inside the second holding unit 111. The suction pipe 140 is connected to an exhaust device (not shown), e.g., a vacuum pump.

Further, a heating mechanism 141 configured to heat the support wafer S is installed inside the second holding unit 111. For example, a heater may be used as the heating mechanism 141.

A moving mechanism 150 configured to vertically and horizontally move the second holding unit 111 and the support wafer S is provided below the second holding unit 111. The moving mechanism 150 includes a vertical moving unit 151 configured to vertically move the second holding unit 111, and a horizontal moving unit 152 configured to horizontally move the second holding unit 111.

The vertical moving unit 151 includes a support plate 153 for supporting the bottom surface of the second holding unit 111, a drive unit 154 for elevating up and down the support plate 153, and support members 155 for supporting the support plate 153. The drive unit 154 is equipped with, e.g., a ball screw (not shown) and a motor (not shown) to rotate the ball screw. The support members 155 are vertically expansible/contractible and are disposed at, e.g., three places between the support plate 153 and a support body 161, which will be described later.

The horizontal moving unit 152 includes a rail 160 extending in the X-axis direction (the left and right direction in FIG. 3), the support body 161 mounted to the rail 160, and a drive unit 162 for moving the support body 161 along the rail 160. The drive unit 162 is equipped with, e.g., a ball screw (not shown) and a motor (not shown) to rotate the ball screw.

In addition, elevating pins (not shown) which elevate the overlapped wafer T or the support wafer S supported from the bottom are disposed below the second holding unit 111. The elevating pins are inserted through through-holes (not shown) formed in the second holding unit 111 in such a manner that they project from the upper surface of the second holding unit 111.

An inert gas supply mechanism 170 configured to supply an inert gas to the bonding surface $W_J$ of the wafer to be processed W is provided at the forward side of the second holding unit 111 in the X-axis direction, for example. The inert gas supply mechanism 170 includes a flat plate-like porous portion 171 with a plurality of fine holes formed therein, and a gas supply pipe 172 configured to supply an inert gas to the porous portion 171. In addition, the inert gas supply mechanism 170 is supported by the support body 161 of the horizontal moving unit 152 via a support member 173. The inert gas supply mechanism 170 can be horizontally moved by moving the horizontal moving unit 152. As example of the porous portion 171 may include a silicon carbide.

Figure 4:
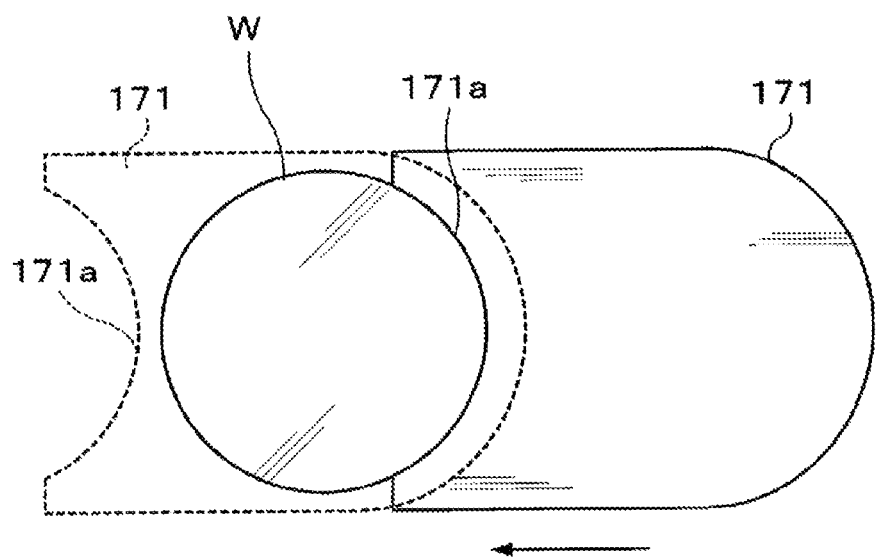
FIG. 4 is a plane view schematically showing a configuration of a porous portion.

As shown in FIG. 4, the porous portion 171 is formed in a flat plate shape to cover the wafer to be processed W as viewed from the top. Further, in an end portion of the porous portion 171 in a moving direction by the horizontal moving unit 152 is formed a concave portion 171a which is formed in a concave shape in conformity to a shape of the wafer to be processed W as viewed from the top. Specifically, as shown in FIG. 4, the end portion of the porous portion 171 in the moving direction is formed in a semicircular arc shape having substantially the same diameter as that of the wafer to be processed W, and a portion other than the concave portion 171a of the porous portion 171 is formed to have a size capable of covering the wafer to be processed W. Also, an opposite end portion of the concave portion 171a in the porous portion 171 is formed in an outwardly convex semicircular arc shape having a diameter larger than that of the wafer to be processed W. This shape makes the porous portion 171 to have a minimal size enough to cover the wafer to be processed W. In some embodiments, the size of the porous portion 171 is not limited to this embodiment but may be selected as appropriate.

As shown in FIG. 3, the porous portion 171 is provided parallel to the bonding surface $W_J$ of the wafer to be processed W. Further, as shown in FIG. 4, in a state where the first holding unit 110 and the second holding unit 111 are opposite to each other, i.e., the wafer to be processed W and the support wafer S are bonded to each other, the concave portion 171a of the porous portion 171 is brought into contact with a peripheral portion of the wafer to be processed W as viewed from the top.

The porous portion 171 is adjusted to be positioned below the bonding surface $W_J$ of the wafer to be processed W in a vertical direction. In other words, the porous portion 171 and the bonding surface $W_J$ of the wafer to be processed W are spaced apart from each other by a predetermined distance in the vertical direction. In this embodiment, the distance is set to 2 mm.

Figure 5:
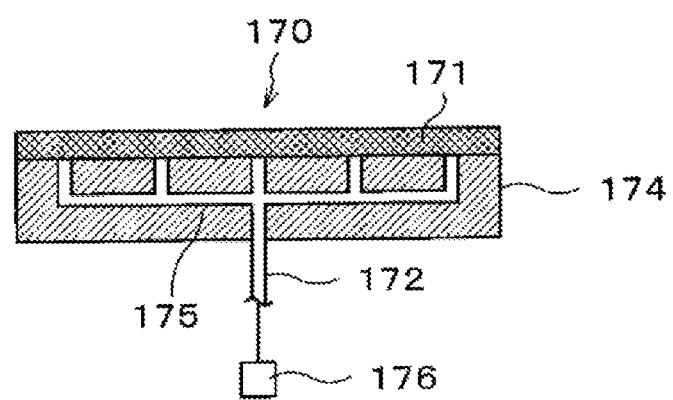
FIG. 5 is a longitudinal sectional view schematically showing a configuration of an inert gas supply mechanism.

As shown in FIG. 5, a flat plate-like dispersion plate 174 is disposed at the bottom surface of the porous portion 171 to cover the porous portion 171. An example of the dispersion plate 174 may include a metal plate such as aluminum or stainless steel. The dispersion plate 174 has a gas channel 175 formed therein. The gas supply pipe 172 is connected to the gas channel 175 of the dispersion plate 174.

An end portion of the gas supply pipe 172 opposite to the dispersion plate 174 is connected to an inert gas supply source 176 configured to supply an inert gas such as a nitrogen gas. In addition, the gas channel 175 of the dispersion plate 174 is branched out in plural channels from a portion to which the gas supply pipe 172 is connected toward the porous portion 171 so that the inert gas can be uniformly supplied to the inner-plane of the porous portion 171. This allows the inert gas supplied from the inert gas supply source 176 to be uniformly supplied to the inner-plane of the porous portion 171 via the dispersion plate 174. In some embodiments, instead of the nitrogen gas used in the above embodiment, an oxygen atom-free gas may be used as the inert gas.

Figure 6:
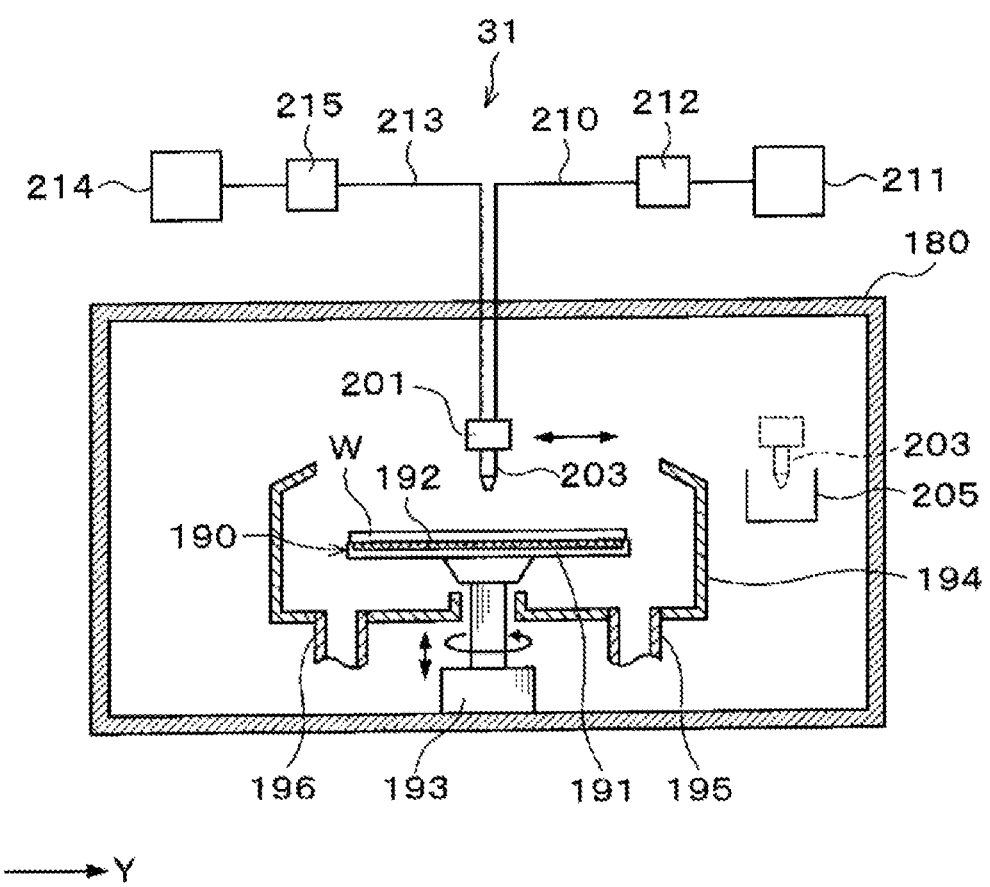
FIG. 6 is a longitudinal sectional view schematically showing a configuration of a first cleaning device.

Next, a configuration of the aforementioned first cleaning device 31 will be described. As shown in FIG. 6, the first cleaning device 31 includes a housing 180. An inlet/outlet (not shown) through which the wafer to be processed W is passed, is formed in a lateral side of the housing 180, and an opening/closing shutter (not shown) is installed in the inlet/outlet.

A porous chuck 190 configured to hold and rotate the wafer to be processed W is installed in the central portion of the housing 180. The porous chuck 190 includes a flat plate main body 191, and a porous 192 formed on an upper surface of the main body 191. The porous 192 has substantially the same diameter as that of the wafer to be processed W and is brought into contact with the non-bonding surface $W_N$ of the wafer to be processed W. For example, a silicon carbide may be used as the porous 192. A suction pipe (not shown) is connected to the porous 192. The non-bonding surface $W_N$ of the wafer to be processed W is sucked by the suction pipe through the porous 192 so that the wafer to be processed W is adsorbed on the porous chuck 190.

A chuck drive unit 193, which is equipped with, e.g., a motor, is provided below the porous chuck 190. The porous chuck 190 can be rotated at a predetermined speed by the chuck drive unit 193. Further, the chuck drive unit 193 includes an elevation driving source such as a cylinder such that the porous chuck 190 can be moved up and down.

A cup 194 is provided around the porous chuck 190 to receive and collect liquid dropped or scattered from the wafer to be processed W. A discharge pipe 195 for draining the collected liquid and an exhaust pipe 196 for applying vacuum into the cup 194 and discharging an atmosphere therewithin are connected to the bottom surface of the cup 194.

Figure 7:
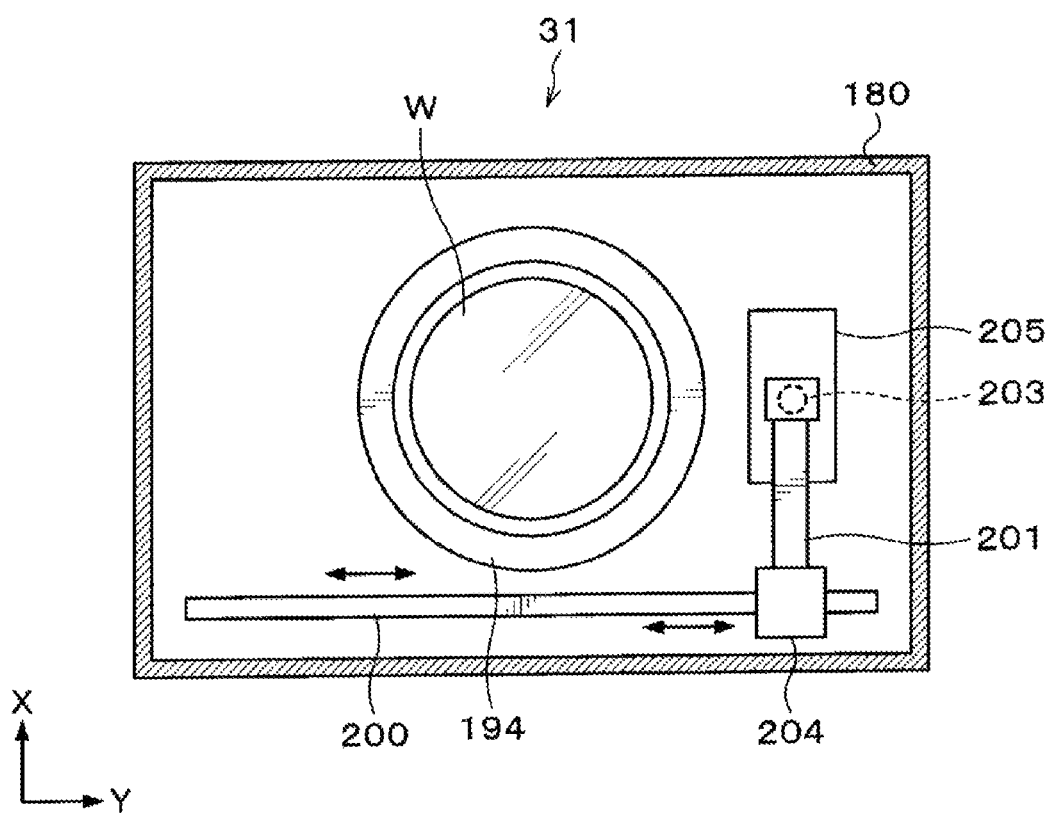
FIG. 7 is a transverse sectional view schematically showing a configuration of the first cleaning device.

As shown in FIG. 7, a rail 200 extending in the Y-axis direction (the left and right direction in FIG. 7) is formed at the backside (or back) of the cup 194 in the X-axis direction (at the lower side in FIG. 7) of the cup 194. The rail 200 extends from the outer backside (the left side in FIG. 7) to the outer front side (the right side in FIG. 7) of the cup 194 in the Y-axis direction, for example. An arm 201 is mounted in the rail 200.

As shown in FIGS. 6 and 7, a cleaning solution nozzle 203 which supplies a cleaning solution such as an organic solvent to the wafer to be processed wafer W is supported by the arm 201. As shown in FIG. 7, the arm 201 is movable along the rail 200 by a nozzle drive unit 204. With this configuration, the cleaning solution nozzle 203 can move from a standby section 205 provided at outer front of the cup 194 in the Y-axis direction to outer backside of the wafer to be processed W, and also can move along the diameter direction of the wafer to be processed W. The arm 201 is vertically movable by the operation of the nozzle drive unit 204 to adjust the height of the cleaning solution nozzle 203.

For example, a two-fluid nozzle is used as the cleaning solution nozzle 203. As shown in FIG. 6, the cleaning solution nozzle 203 is connected to a supply pipe 210 through which the cleaning solution is supplied to the cleaning solution nozzle 203. The supply pipe 210 is in communication with a cleaning solution supply source 211 to store the cleaning solution therein. A supply kit 212 including a valve, a flow rate regulator or the like, which controls a flow of the cleaning solution, is installed in the supply pipe 210. The cleaning solution nozzle 203 is connected to a supply pipe 213 through which an inert gas such as a nitrogen gas is supplied to the cleaning solution nozzle 203. The supply pipe 213 is in communication with a gas supply source 214 to store the inert gas therein. A supply kit 215 including a valve, a flow rate regulator or the like, which controls a flow of the inert gas, is installed in the supply pipe 213. The cleaning solution and the inert gas are mixed inside the cleaning solution nozzle 203 so that the mixture is supplied to the wafer to be processed W. Hereinafter, in some cases, the mixture of the cleaning solution and the inert gas is simply referred to as a "cleaning solution."

Elevating pins (not shown) which elevate the wafer to be processed W supported from the bottom may be installed below the porous chuck 190. In such a case, the elevating pins are inserted through through-holes (not shown) formed in the porous chuck 190 in such a manner that they project from the upper surface of the porous chuck 190. Further, the wafer to be processed W may be separated from the porous chuck 190 by elevating the elevating pins upward instead of elevating the porous chuck 190. Since configurations of the bonding surface cleaning section 8a and the non-bonding surface cleaning section 8b of the aforementioned cleaning device 8 are similar to that of the first cleaning device 31 and therefore a description thereof will be omitted to avoid duplication.

Figure 8:
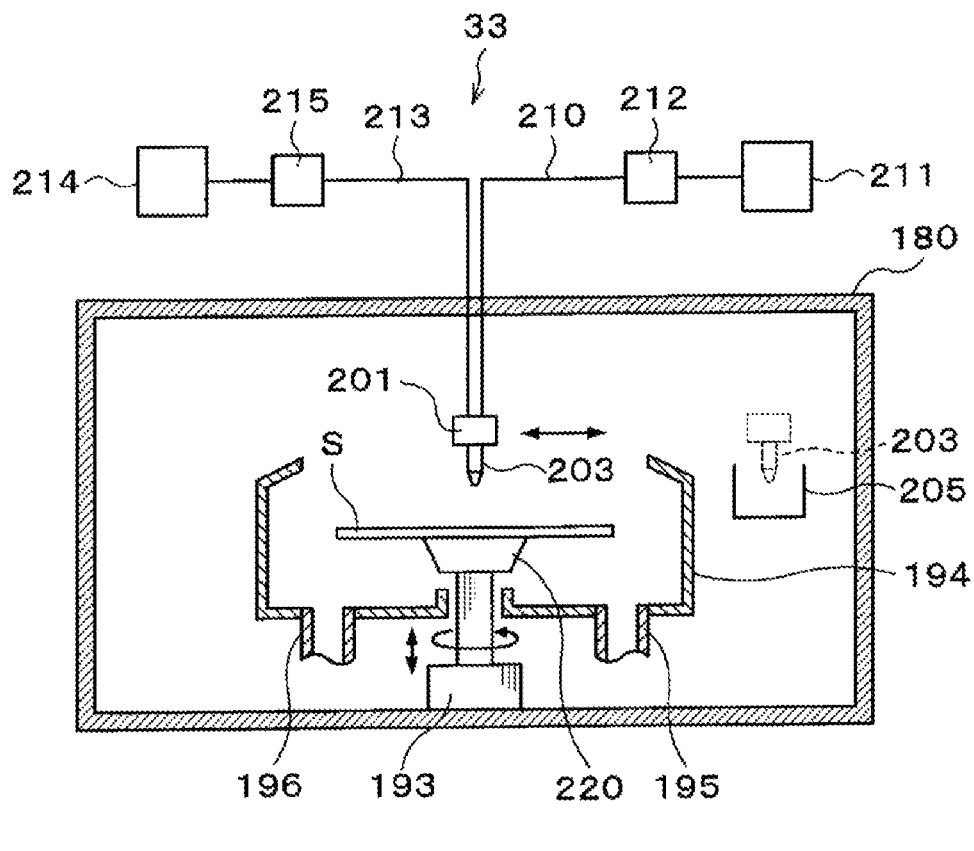
FIG. 8 is a longitudinal sectional view schematically showing a configuration of a second cleaning device.

The second cleaning device 33 has approximately the same configuration as that of the aforementioned first cleaning device 31. As shown in FIG. 8, in the second cleaning device 33, a spin chuck 220 is installed instead of the porous chuck 190 of the first cleaning device 31. The spin chuck 220 has a horizontal upper surface on which suction holes (not shown) for sucking, e.g., the support wafer S, is formed. By the suctioning force of the suction holes, the support wafer S can be adsorbed on the spin chuck 220. The other configurations of the second cleaning device 33 are similar to those of the first cleaning device 31 and therefore, a description thereof will be omitted to avoid duplication.

In the second cleaning device 33, a back rinse nozzle (not shown) which injects the cleaning solution toward the rear surface of the wafer to be processed W, i.e., the non-bonding surface $W_N$, may be installed below the spin chuck 220. The cleaning solution injected from the back rinse nozzle cleans the non-bonding surface $W_N$ of the wafer to be processed W and the peripheral portion thereof.

Figure 9:
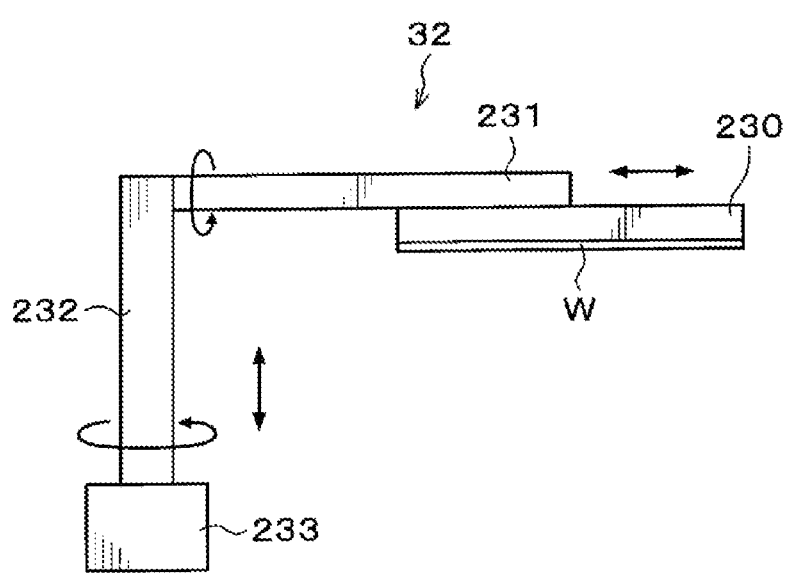
FIG. 9 is a lateral view schematically showing a configuration of a second transfer unit.

Next, a configuration of the aforementioned transfer unit 32 will be described. As shown in FIG. 9, the second transfer unit 32 includes a Bernoulli chuck 230 configured to hold the wafer to be processed W. The Bernoulli chuck 230 blasts air to float the wafer to be processed W so that the wafer to be processed W can be held with it oriented downward in a contactless state. The Bernoulli chuck 230 is supported by a support arm 231. The support arm 231 is supported by a first drive unit 232. By the operation of the first drive unit 232, the support arm 231 is rotatable around a horizontal axis and also horizontally expansible/contractible. A second drive unit 233 is provided below the first drive unit 232. By the operation of the second drive unit 233, the first drive unit 232 is rotatable around a vertical axis and also vertically movable.

A configuration of the third transfer unit 41 shown in FIG. 1 is similar to that of the aforementioned second transfer unit 32 except that the second drive unit 233 of the third transfer mechanism 41 is mounted on the transfer path, and the third transfer unit 41 is configured to be movable along the transfer path 40. Therefore a description thereof will be omitted to avoid duplication.

As shown in FIG. 1, the aforementioned peeling system 1 includes a control unit 300. The control unit 300 is, for example, a computer, and includes a program storage (not shown). The program storage stores a program which controls processing of the wafer to be processed W, the support wafer S and the overlapped wafer T in the peeling system 1. The program storage also stores a program which controls operation of a driving system including the aforementioned processing devices and the transfer unit to implement a peeling process in the peeling system 1, which will be described later. The programs may be installed in the control unit 300a from a computer readable storage medium H such as a hard disk (HD), a flexible disk (FD), a compact disk (CD), a magneto-optical disk (MO), a memory card or the like.

Figure 10:
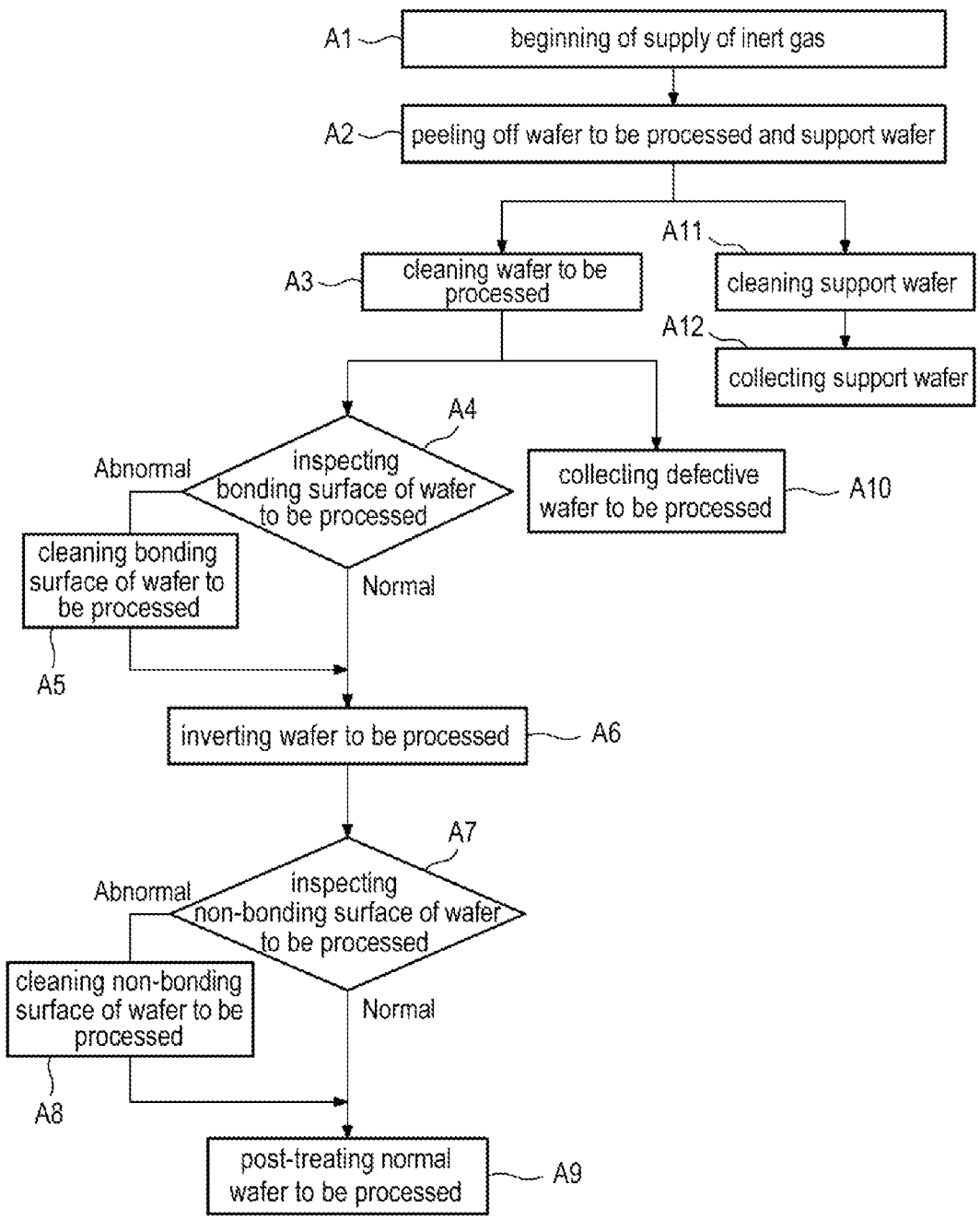
FIG. 10 is a flowchart illustrating main operations of a peeling process.

Next, a peeling process of the wafer to be processed W and the support wafer S, which is performed using the peeling system 1 configured as above, will be described. FIG. 10 is a flowchart illustrating main operations of the peeling process.

First, a cassette $C_T$ with a plurality of overlapped wafers T accommodated therein, an empty cassette $C_W$, and an empty cassette $C_S$ are loaded on a respective cassette loading plate 11 of the carry-in/carry-out station 2. Thereafter, each of the overlapped wafers T within the cassette $C_T$ is taken out by the first transfer unit 20, and then is transferred to the peeling device 30 of the peeling process station 3. At this time, the overlapped wafer T is transferred while the wafer to be processed W is positioned at the upper surface and the support wafer S is positioned at the lower side.

Figure 11:
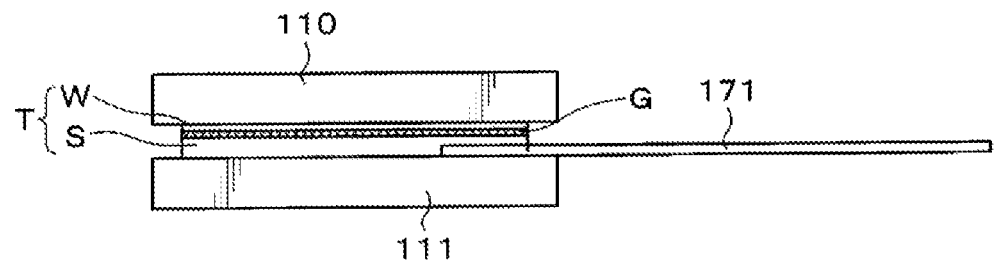
FIG. 11 is a view showing a state where an overlapped wafer is held by a first holding unit and a second holding unit.

The overlapped wafer T loaded into the peeling device 30 is adsorbed to the second holding unit 111. Thereafter, the second holding unit 111 is elevated by the moving mechanism 150 so that, as shown in FIG. 11, the overlapped wafer T is held by the first holding unit 110 and the second holding unit 111 with the overlapped wafer T interposed therebetween. At this time, the non-bonding surface $W_N$ of the wafer to be processed W is adsorbed to the first holding unit 110, and the non-bonding surface $S_N$ of the support wafer S is adsorbed to the second holding unit 111.

Thereafter, the overlapped wafer T is heated to a predetermined temperature, e.g., 200 degrees C., by the heating mechanisms 124 and 141. Thus, the adhesive G in the overlapped wafer T is softened (see FIG. 5). Further, while heating the overlapped wafer T, the inert gas is supplied from the inert gas supply source 176 to the inert gas supply mechanism 170. With this configuration, the inert gas is supplied from a surface opposite to a surface covered by the dispersion plate 174 in the porous portion 171, e.g., from an upper surface of the porous portion 171 in this embodiment, via the gas supply pipe 172 and the dispersion plate 174. At this time, the inert gas passes through the porous portion 171 with the plurality of fine holes formed therein, which limits a flow rate of the inert gas passing through the porous portion 171. This prevents the circumambient air from being flown in the upper surface of the porous portion 171 during the course of the inert gas supply. This forms an air-free inert gas atmosphere in the upper surface of the porous portion 171 (Operation A1 in FIG. 10). In addition, the branched-out gas channel 175 facing the porous portion 171 is formed inside the dispersion plate 174 so that the inert gas is uniformly supplied from the entire upper surface of the porous portion 171.

Figure 12:
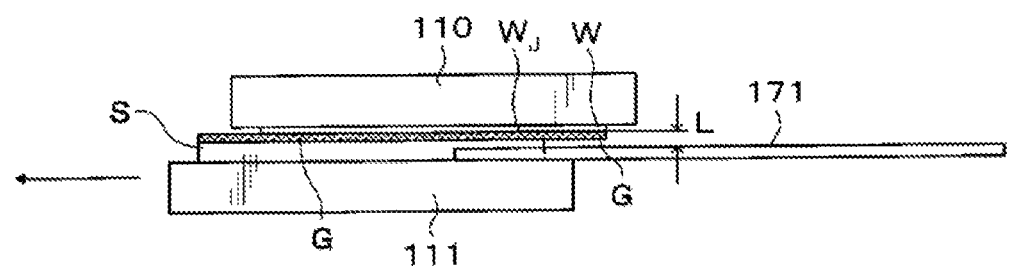
FIG. 12 is a view showing a state where the second holding unit is moved in vertical and horizontal directions.

Subsequently, as shown in FIG. 12, while heating the overlapped wafer T by the heating mechanisms 124 and 141 and maintaining the soft state of the adhesive G, the second holding unit 111 and the support wafer S are moved by the horizontal moving unit 152 of the moving mechanism 150 in the horizontal direction. In addition, since the inert gas supply mechanism 170 is supported by the horizontal moving unit 152 through the support body 161, the inert gas supply mechanism 170 is also moved in the horizontal direction together with the second holding unit 111 with the operation of the horizontal moving unit 152.

In this case, as shown in FIG. 12, since the porous portion 171 and the bonding surface $W_J$ of the wafer to be processed W are spaced apart from each other by a predetermined vertical distance L, the porous portion 171 moves in the horizontal direction without interfering with the bonding surface $W_J$ of the wafer to be processed W. This allows the bonding surface $W_J$ of the wafer to be processed W exposed by this movement to face the porous portion 171 while being spaced apart by the distance L. During that time, the inert gas is supplied from the porous portion 171 onto the bonding surface $W_J$ of the wafer to be processed W.

Figure 13:
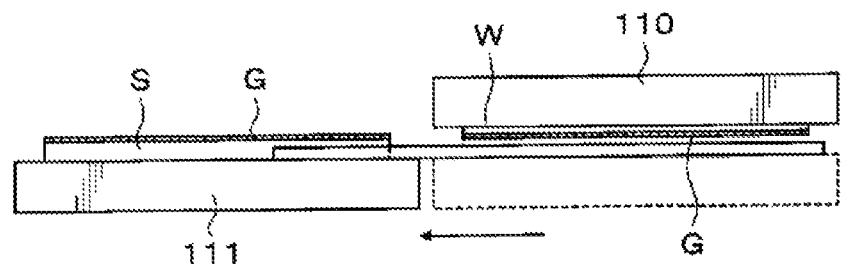
FIG. 13 is a view showing a state where the wafer to be processed and the support wafer are peeled off from each other.

Thereafter, while continuously supplying the inert gas from the porous portion 171, as shown in FIG. 13, the second holding unit 111 is moved in the horizontal direction, and the wafer to be processed W held by the first holding unit 110 and the support wafer S held by the second holding unit 111 are peeled off (Operation A2 in FIG. 10). As described above, since the porous portion 171 is formed to have a size enough to cover the wafer to be processed W as viewed from the top, the inert gas from the porous portion 171 is continuously supplied onto the bonding surface $W_J$ of the wafer to be processed W which has been peeled off.

Then, after a temperature of the wafer to be processed W is lowered to a predetermined temperature, e.g., about 100 degrees C. or less, when any oxidation is not occurred in the bonding surface $W_J$ of the wafer to be processed W, the supply of the inert gas from the porous portion 171 is stopped.

Figure 14:
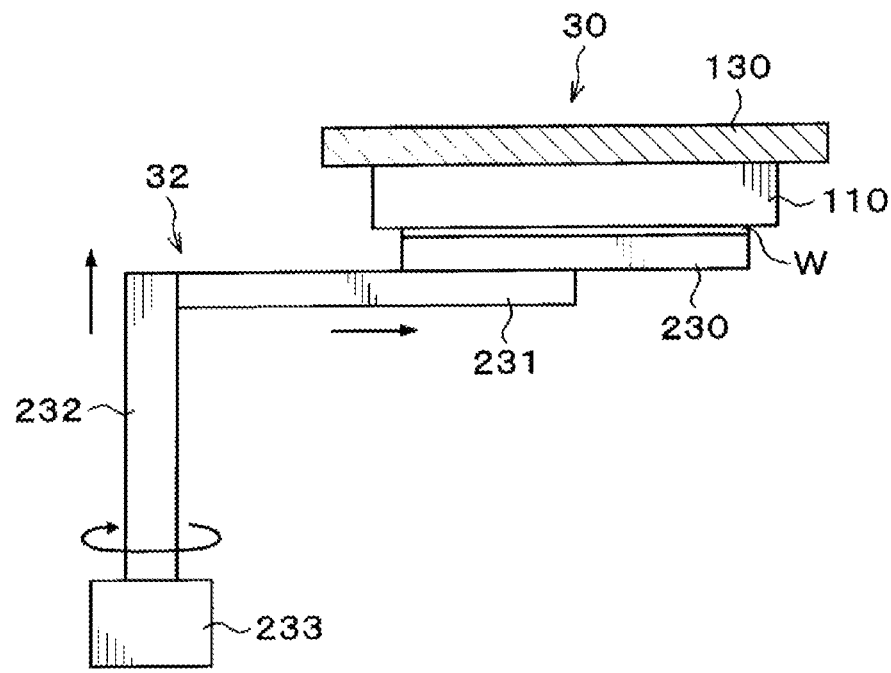
FIG. 14 is a view showing a state where the wafer to be processed is transferred from the first holding unit to a Bernoulli chuck.

Thereafter, the wafer to be processed W peeled by the peeling device 30 is transferred to the first cleaning device 31 by the second transfer unit 32. As shown in FIG. 14, in the transfer of the wafer to be processed W by the second transfer unit 32, the support arm 231 is extended such that the Bernoulli chuck 230 is placed below the wafer to be processed W held by the first holding unit 110. Subsequently, the Bernoulli chuck 230 is elevated upward such that the suction of the wafer to be processed W by the suction pipe 123 in the first holding unit 110 is stopped. Thereafter, the wafer to be processed W is transferred from the first holding unit 110 to the Bernoulli chuck 230. At this time, the Bernoulli chuck 230 holds the bonding surface $W_J$ of the wafer to be processed W in a contactless manner. Therefore, it is possible to transfer the wafer to be processed W without damaging the electronic circuits formed on the bonding surface $W_J$ of the wafer to be processed W.

Figure 15:
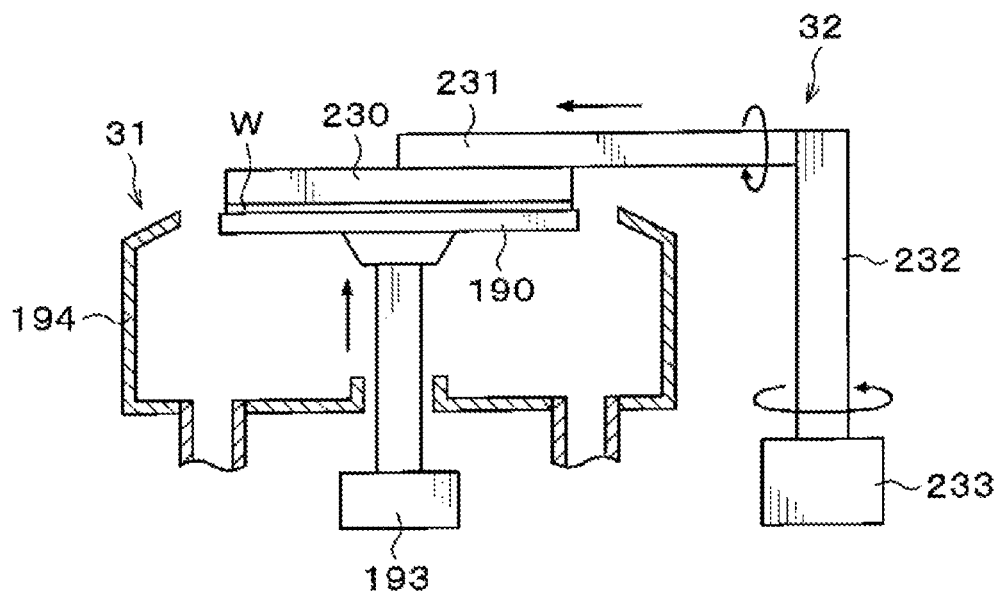
FIG. 15 is a view showing a state where the wafer to be processed is transferred from the Bernoulli chuck to a porous chuck.

Next, as shown in FIG. 15, the support arm 231 rotates such that the Bernoulli chuck 230 is lifted above the porous chuck 190 of the first cleaning device 31. Simultaneously, the Bernoulli chuck 230 is inverted to orient the wafer to be processed W downward. At this time, the porous chuck 190 is elevated above the cup 194 and is on standby. Thereafter, the wafer to be processed W is transferred from the Bernoulli chuck 230 to the porous chuck 190 and then is adsorbed to the porous chuck 190.

As described above, when the wafer to be processed W is adsorbed to the porous chuck 190, the porous chuck 190 is lowered to a predetermined position. Subsequently, the arm 201 moves the cleaning solution nozzle 203 positioned within the standby section 205 above the central portion of the wafer to be processed W. Thereafter, the cleaning solution is supplied from the cleaning solution nozzle 203 onto the bonding surface $W_J$ of the wafer to be processed W while rotating the wafer to be processed W by the porous chuck 190. The supplied cleaning solution is spread to the entire surface of the bonding surface $W_J$ of the wafer to be processed W by virtue of a centrifugal force caused by the rotation so that the bonding surface $W_J$ of the wafer to be processed W is cleaned (Operation A3 in FIG. 10).

As described above, the plurality of the overlapped wafers T loaded into the carry-in/carry-out station 2 are inspected in advance to distinguish a normal overlapped wafer T including a normal wafer to be processed W and an abnormal overlapped wafer T including an abnormal wafer to be processed W.

The bonding surface $W_J$ of the normal wafer to be processed W peeled off from the normal overlapped wafer T is cleaned in operation A3, and then is transferred to the inspection device 6 by the third transfer unit 41. The transfer of the wafer to be processed W by the third transfer unit 41 is substantially similar to that of the wafer to be processed W by the aforementioned second transfer unit 231. Therefore a description thereof will be omitted to avoid duplication.

The inspection device 6 inspects whether the residual of the adhesive G exists on the bonding surface $W_J$ of the wafer to be processed W (Operation A4 in FIG. 10). If the residual of the adhesive G is determined to exist by the inspection device 6, the wafer to be processed W is transferred to the bonding surface cleaning section 8a of the cleaning device 8 by the third transfer unit 41 where the bonding surface $W_J$ is cleaned (Operation A5 in FIG. 10). After the bonding surface $W_J$ is cleaned, the wafer to be processed W is transferred to the inverting section 8c by the third transfer unit 41 where the wafer to be processed W is inverted up and down. Meanwhile, if no residual of the adhesive G is determined to exist, the wafer to be processed W is inverted by the inverting section 8c without being transferred to the bonding surface cleaning section 8a (Operation A6 in FIG. 10).

Thereafter, the inverted wafer to be processed W is again transferred to the inspection device 6 by the third transfer unit 41 where the inspection is performed on the non-bonding surface $W_N$ (Operation A7 in FIG. 10). If the residual of the adhesive G is determined to exist in the non-bonding surface $W_N$, the wafer to be processed W is transferred to the non-bonding surface cleaning unit 8c by the third transfer unit 41 where the non-bonding surface $W_N$ is cleaned (Operation A8 in FIG. 10). Subsequently, the cleaned wafer to be processed W is transferred to the post-treatment station 4 by the third transfer unit 41. Meanwhile, if no residual of the adhesive G is determined to exist by the inspection device 6, the wafer to be processed W is transferred to the post-treatment station 4 as it is without being transferred to the non-bonding surface cleaning section 8b.

Thereafter, the wafer to be processed W is subjected to the predetermined post-treatment in the post-treatment station 4 (Operation A9 in FIG. 10). In this manner, the wafer to be processed W is used as a product.

On the other hand, the bonding surface $W_J$ of the abnormal wafer to be processed W peeled off from the abnormal overlapped wafer T is cleaned in Operation A3 and then is transferred to the carry-in/carry-out station 2 by the transfer mechanism 20. Thereafter, the abnormal wafer to be processed W is discharged from the carry-in/carry-out station 2 to the outside for the collection (Operation A10 in FIG. 10).

While the aforementioned operations A3 to A10 are performed on the wafer to be processed W, the support wafer S peeled by the peeling device 30 is transferred to the second cleaning device 33 by the first transfer unit 20. In the second cleaning device 33, the bonding surface $S_J$ of the support wafer S is cleaned (Operation A11 in FIG. 10). The cleaning of the support wafer S in the second cleaning device 33 is similar to that of the wafer to be processed W in the aforementioned first cleaning device 31 and, therefore a description thereof will be omitted to avoid duplication.

Thereafter, the support wafer S having the cleaned bonding surface $S_J$ is transferred to the carry-in/carry-out station 2 by the first transfer unit 20. The support wafer S is then discharged from the carry-in/carry-out station 2 to the outside for the collection (Operation A12 in FIG. 10). In this manner, a series of the peeling processes for the wafer to be processed W and the support wafer S is terminated.

According to the above embodiments, since the inert gas is supplied from the porous portion 171 of the inert gas supply mechanism 170 onto the bonding surface $W_J$ of the wafer to be processed W, which is exposed by moving the first holding unit 110 and the second holding unit 111 relative to each other in the horizontal direction using the moving mechanism 150, the inert gas atmosphere can be formed on the bonding surface $W_J$ of the wafer to be processed W exposed by the peeling. This makes it possible to prevent the rapid oxidation from being generated on the heated bonding surface $W_J$ of the wafer to be processed W. Therefore, in order to prevent the rapid oxidation from being generated on the heated bonding surface $W_J$ of the wafer to be processed W, it is not necessary to take an aggressive measure to cover the wafer to be processed W with the airtight container. According to the present disclosure, it is possible to efficiently prevent the heated bonding surface $W_J$ of the wafer to be processed W from being oxidized when the overlapped wafer T is peeled off.

In addition, since the porous portion 171 of the inert gas supply mechanism 170 is of a dimension large enough to cover the wafer to be processed W, the inert gas can be supplied over the entire surface of the bonding surface $W_J$ of the wafer to be processed W peeled off. Therefore, it is possible to prevent the oxidation from occurring over the entire surface of the wafer to be processed W.

Figure 16:
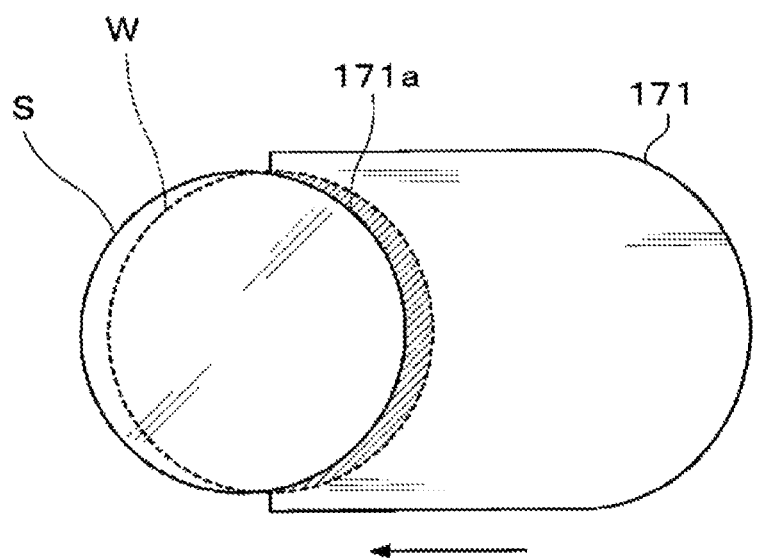
FIG. 16 is a plane view showing a state where the wafer to be processed and the support wafer are relatively moved in the horizontal direction.

Further, since the concave portion 171a, which is formed in a concave shape in conformity to the shape of the wafer to be processed W as viewed from the top, is formed in the end of the porous portion 171 in its moving direction, it is possible to dispose the porous portion 171 in a position at which the porous portion 171 is brought into contact with the wafer to be processed W as viewed from the top. With this configuration, it is possible to directly supply the inert gas onto the bonding surface $W_J$ of the wafer to be processed W exposed by moving the moving mechanism 150. Specifically, when the first holding unit 110 and the second holding unit 111 are relatively moved with the movement of the moving mechanism 150 in the horizontal direction, the bonding surface $W_J$ of the wafer to be processed W is exposed in a crescent shape (a hatched region in FIG. 16) as shown in FIG. 16. With this configuration, the porous portion 171 is capable of covering the entire surface of the exposed crescent region by disposing the porous portion 171 having the concave portion 171a to bring the concave portion 171a into contact with the wafer to be processed W as viewed from the top. This configuration allows the inert gas to be supplied onto the entire exposed surface of the bonding surface $W_J$. Although the concave portion 171a has been described as being in contact with the peripheral portion of the wafer to be processed W as viewed from the top, it does not mean that the entire periphery of the concave portion 171a is in contact with the peripheral portion of the wafer to be processed W when the arc diameter of the concave portion 171a coincides with the diameter of the wafer to be processed W. That is, the concave portion 171a of the porous portion 171 and the peripheral portion of the wafer to be processed W approach each other as viewed from the top to such an extent that, when the bonding surface $W_J$ of the wafer to be processed W is exposed by the peeling, the bonding surface $W_J$ is covered with the inert gas atmosphere over the porous portion 171 without being exposed to the internal atmosphere of the housing 100.

In addition, the dispersion plate 174 is provided to cover the porous portion 171 and the inert gas is supplied to the porous portion 171 via the dispersion plate 174 so that the inert gas can be uniformly supplied from the entire surface of the porous portion 171 opposite to the dispersion plate 174. Therefore, it is possible to uniformly supply the inert gas to the entire surface of the bonding surface $W_J$ of the wafer to be processed W, thus preventing the oxidation of the bonding surface $W_J$ with better certainty.

In addition, since the end portion opposite to the concave portion 171a in the porous portion 171 is formed in an outwardly-convex semicircular arc shape which has a diameter larger than that of the wafer to be processed W, the porous portion 171 can have a minimal size enough to cover the wafer to be processed W. This reduces the surface area of the porous portion 171, thus decreasing an amount of the inert gas supplied from the porous portion 171.

While in the above embodiments, the porous portion 171 has been described to be made of the silicon carbide, the present disclosure is not limited thereto. As an example, Teflon® or the like may be used as long as it has a plurality of fine holes which prevents the circumambient air from being introduced when the inert gas is supplied from the porous portion 171.

While in the above embodiments, the distance L between the porous portion 171 and the bonding surface $W_J$ of the wafer to be processed W has been described to be set to 2 mm, the distance may fall within a range of 0.5 mm to 4 mm. In the range, the inert gas can be properly supplied onto the bonding surface $W_J$ of the wafer to be processed W, thus preventing the rapid oxidation from being generated.

Further, while in the above embodiments, the porous portion 171 has been described to be disposed parallel to the bonding surface $W_J$ of the wafer to be processed W, the present disclosure is not limited thereto. In some embodiments, the porous portion 171 may be obliquely disposed with respect to the bonding surface $W_J$ as long as the distance L between the porous portion 171 and the bonding surface $W_J$ falls within the range of 0.5 mm to 4 mm.

In the above embodiments, the second holding unit 111 has been described to be moved relative to the first holding unit 110 in the horizontal direction but may be moved by 100 μm in the vertical direction in addition to the movement in the horizontal direction. As an example, in this embodiment, the horizontal moving distance of the second holding unit 111 is 300 mm, the thickness of the adhesive G of the overlapped wafer T is, e.g., 30 μm to 40 μm, and the height of the electronic circuits (bumps) formed on the bonding surface $W_J$ of the wafer to be processed W is, e.g., 20 μm. In this case, a distance between the electronic circuits formed on the wafer to be processed W and the support wafer S is very small. As such, when the second holding unit 111 is moved only, e.g., in the horizontal direction, the electronic circuits are brought into contact with the support wafer S, which damages the electronic circuits. For this reason, the second holding unit 111 is moved in both the horizontal and vertical directions, thus preventing the electronic circuits from being brought into contact with the support wafer S, which prevents the electronic circuits from being damaged. In addition, a ratio of the vertical moving distance and the horizontal moving distance of the second holding unit 111 is properly set based on the height of the electronic circuits (bumps) formed on the wafer to be processed W but is not limited thereto.

In some embodiments, the first holding unit 110 may be moved instead of the second holding unit. Even in such a case, the first holding unit 110 may be moved in both the vertical and horizontal directions. Alternatively, both the first holding unit 110 and the second holding unit 111 may be moved in the vertical and horizontal directions. In addition, even in a case where any of the first holding unit 110 and the second holding unit 111 is moved, a method of moving or supporting the inert gas supply mechanism 170 may be set as appropriate as long as the inert gas supply mechanism 170 may be configured to horizontally move relative to the wafer to be processed W held by the first holding unit 110, i.e., the object to be supplied with the inert gas. For example, when the first holding unit 110 is horizontally moved, the inert gas supply mechanism 170 may be supported by the ceiling surface of the housing 100 or by the bottom surface of the housing 100. In either case, the exposed bonding surface $W_J$ of the wafer to be processed W is maintained at the inert gas atmosphere as long as if the wafer to be processed W is horizontally moved above the inert gas supply mechanism 170 while being spaced apart from the inert gas supply mechanism 170 by the predetermined distance L.

While the second holding unit 111 has been described to be moved in the vertical and horizontal directions in the peeling device 30, the second holding unit 111 may be moved only in the horizontal direction and a moving speed thereof may be varied. As an example, an initial moving speed of the second holding unit 111 may be set to a lower level and be gradually increased. That is, when the second holding unit 111 starts to move, since a bonding area between the wafer to be processed W and the support wafer S is large so that the electronic circuit formed on the wafer to be processed W can be easily influenced by the adhesive G, the initial moving speed of the second holding unit 111 is set to a lower level. Thereafter, since the electronic circuit formed on the wafer to be processed W is hard to be influenced by the adhesive G as the bonding area between the wafer to be processed W and the support wafer S becomes small, the moving speed of the second holding unit 111 is gradually increased. This avoids the contact between the electronic circuit and the support wafer S, thus preventing the electronic circuit from being damaged.

In addition, when the wafer to be processed W and the support wafer S are peeled off from each other, a peeling electrostatic charge may generate static electricity in some cases. The static electricity by the peeling electrostatic charge may damage the wafer to be processed W. Thus, in order to prevent the peeling electrostatic charge, an inert gas ionized by an ionizer may be used as the inert gas which is supplied from the inert gas supply mechanism 170. The use of the ionized inert gas prevents the wafer to be processed W from being damaged by the static electricity.

According to the above embodiments, after the wafer to be processed W and the support wafer S are peeled off from the overlapped wafer T in the peeling device 30, the peeled-off wafer to be processed W can be cleaned by the first cleaning device 31 and the peeled-off support wafer S can be cleaned by the second cleaning device 33. As described above, according to the above embodiments, a series of processes including peeling the wafer to be processed W and the support wafer S and cleaning the wafer to be processed W and the support wafer S can be effectively performed in the single peeling system 1. Furthermore, the cleaning of the wafer to be processed W and the cleaning of the support wafer S are simultaneously performed in the first cleaning device 31 and the second cleaning device 33, respectively. Further, while the wafer to be processed W and the support wafer S are peeled off from each other in the peeling device 30, another wafer to be processed W and another support wafer S may also be processed in the first cleaning device 31 and the second cleaning device 33, respectively. Therefore, it is possible to efficiently perform the peeling of the wafer to be processed W and the support wafer S, which improves a throughput of the peeling process.

In addition, when the wafer to be processed W peeled by the peeling process station 3 is the normal wafer to be processed W, it is subjected to the predetermined post-treatment in the post-treatment station 4 to use the same as a product. On the other hand, when the wafer to be processed W peeled by the peeling process station 3 is the abnormal wafer to be processed W, it is collected by the carry-in/carry-out station 2. Accordingly, since only the normal wafer to be processed W is used as the product, it is possible to improve the production yield. Further, the abnormal wafer to be processed W is collected. This collected wafer to be processed W may be reused depending on an abnormal degree, which makes an effective use of resources and reduces manufacturing costs.

The series of processes as described above, including the peeling of the wafer to be processed W and the support wafer S and the post-treatment of the wafer to be processed W are performed, thus further improving the production yield of process for the wafer.

In addition, the support wafer S peeled by the peeling device 30 is cleaned and then is collected by the carry-in/carry-out station 2 so that the support wafer S can be reused. This makes an effective use of resources and reduces manufacturing costs.

In addition, since each of the second transfer unit 32 and the third transfer unit 41 is equipped with the Bernoulli chuck 230 configured to hold the wafer to be processed W, it is possible to stably hold the wafer to be processed W even for a thin one. Further, in the second transfer unit 32, since the Bernoulli chuck 230 holds the bonding surface $W_J$ of the wafer to be processed W in a contactless manner, it is possible to prevent the electronic circuits formed on the bonding surface $W_J$ of the wafer to be processed W from being damaged.

Since the first cleaning device 31 includes the porous chuck 190 configured to hold the wafer to be processed W, it is possible to stably hold the wafer to be processed W even for a thin one.

In the above embodiments, since the inspection device 6 is configured to inspect the wafer to be processed W, it is possible to correct process conditions to be applied in the peeling system 1 based on results of the inspection. This makes it possible to further stably peel off the wafer to be processed W and the support wafer S.

Further, according to the above embodiments, when the inspection apparatus 6 detects an abnormal wafer to be processed W, the cleaning unit after inspection 8 can clean the abnormal wafer to be processed W. Accordingly, since the abnormal wafer to be processed W is not transferred to the post-processing station 4, it is possible to prevent a reduction in the production yield.

In addition, for example, an object to be supplied with the inert gas may be the support wafer S instead of the wafer to be processed W. In this case, the inert gas supply mechanism 170 is provided to be horizontally moved relative to the support wafer S. Even in such a case, the shape or disposition of the porous portion 171 is similar to the case that the object to be supplied with the inert gas is the wafer to be processed W.

While in the above embodiments, the wafer to be processed W and the support wafer S have been described to be peeled off while positioning the wafer to be processed W at the upper side and the support wafer S at the lower side, the positions of the wafer to be processed W and the support wafer S may be reversed.

In the second transfer unit 32 according to the above embodiments, a plurality of supply holes (not shown) through which the cleaning solution is supplied may be formed on a surface of the Bernoulli chuck 230. With this configuration, when the wafer to be processed W is transferred from the Bernoulli chuck 230 to the porous chuck 190 of the first cleaning device 31, the cleaning solution is supplied from the Bernoulli chuck 230 onto the bonding surface $W_J$ of the wafer to be processed W, thus cleaning the bonding surface $W_J$ and also the Bernoulli chuck 230 itself. This reduces the amount of time required to clean the wafer to be processed W in the first cleaning device 31 later, which improves a production yield in the peeling process. Furthermore, since the Bernoulli chuck 230 can be cleaned, it is possible to transfer a subsequent wafer to be processed W in a reliable manner.

While in the above embodiments, the third transfer unit 41 has been described to include the Bernoulli chuck 230, it may include a porous chuck (not shown) instead of the Bernoulli chuck 230. Even in such a case, it is possible to stably absorb a thin wafer to be processed W using the porous chuck.

In the above embodiments, the two-fluid nozzle has been described to be used as the cleaning solution nozzle 203 of the first cleaning device 31 and the second cleaning device 33, but cleaning solution nozzle is not limited thereto and various types of nozzles may be used. As an example, a nozzle body in which a nozzle configured to supply a cleaning solution and a nozzle configured to supply an inert gas are combined, a spray nozzle, a jet nozzle, a megasonic nozzle, or the like may be used as the cleaning solution nozzle 203. In addition, in order to improve a production yield in the cleaning process, a cleaning solution heated to, e.g., 80 degrees C., may be supplied.

In some embodiments, in addition to the cleaning solution nozzle 203, a nozzle configured to supply IPA (isopropyl alcohol) may be provided in the first cleaning device 31 and the second cleaning device 33. In such a case, after the wafer to be processed W or the support wafer S is cleaned by the cleaning solution supplied from the cleaning solution nozzle 203, the cleaning solution supplied onto the wafer to be processed W or the support wafer S is substituted with the IPA. This makes it possible to more reliably clean the bonding surface $W_J$ or $S_J$ of the wafer to be processed W or the support wafer S.

The peeling system 1 according to the above embodiments may include a temperature adjusting unit (not shown) which cools the wafer to be processed W heated in the peeling device 30 up to a predetermined temperature. This makes it possible to adjust the temperature of the wafer to be processed W to a suitable temperature, thus smoothly performing a subsequent process.

In addition, the inert gas supply mechanism 170 of the peeling device 30 may include a heating unit (not shown) such as a heater for heating the inert gas. Alternatively, the inert gas to be supplied to the inert gas supply mechanism 170 may be heated in advance. In some embodiments, the inert gas having approximately the same temperature (e.g., 200 degrees C.) as that of the first holding unit 111 and the second holding unit 112 may be injected from the inert gas supply mechanism 170 toward the wafer to be processed W. With this configuration, the adhesive G can be maintained soft without cooling the overlapped wafer T by the inert gas. Further, since it is possible to prevent the overlapped wafer T from being cooled by the inert gas and being contracted, the electronic circuits formed on the wafer to be processed W cannot be damaged.

Figure 17:
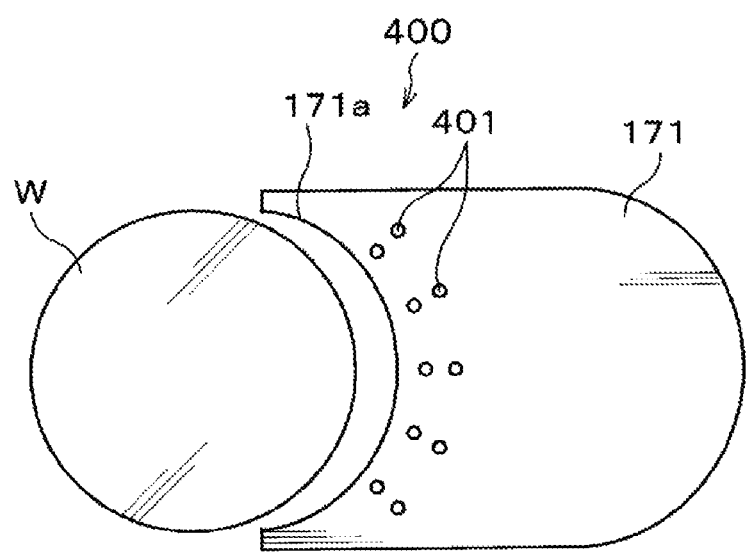
FIG. 17 is a plane view schematically showing a configuration of a monitoring unit which monitors holes being clogged in a porous portion.
Figure 18:
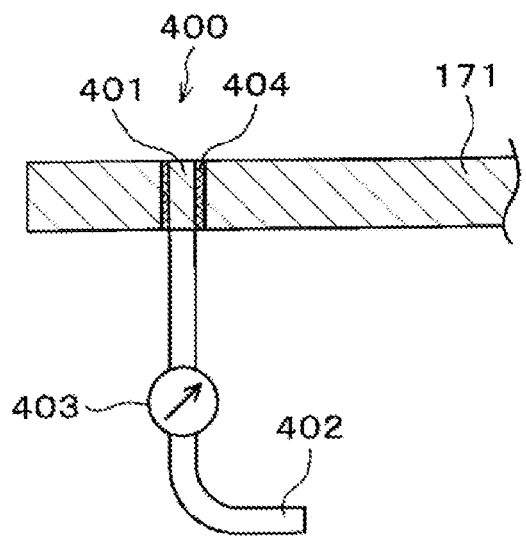
FIG. 18 is a longitudinal sectional view schematically showing a configuration of the monitoring unit.

In some embodiments, as shown in FIGS. 17 and 18, there may be provided a monitoring unit 400 configured to monitor clogging of a plurality of holes formed in the porous portion 171. The monitoring unit 400 includes a plurality of through holes 401 formed in the porous portion 171, pipes 402 with a respective end connected to each of the through holes 401, and manometers 403 installed in the middles of the respective pipes 402. The other end of each of the pipes 402 is opened. Each of the through holes 401 has preferably a small diameter, for example, a diameter of 1 mm. In addition, the through holes 401 are arranged to be spaced apart at predetermined intervals along a line similar to the end portion of the concave portion 171a, wherein the through holes 401 are arranged along a plurality of lines. Further, an inner surface 404 of each of the through holes 401 is sealed by, e.g., coating.

Furthermore, the manometers 403 are installed in each of the plurality of through holes 401 to detect a pressure within each of the through holes 401. The pressure smaller than a predetermined value indicates that clogging of hole in the vicinity of a respective through hole 401 in the porous portion 171 is generated, and an alarm is triggered. Then, the peeling process is stopped to clean the porous portion 171. By doing so, it is possible to prevent the clogging of hole generated in the porous portion 171 and always inject the inert gas uniformly from the porous portion 171.

In the above embodiments, while a difference in pressure between a pressure within the hole and an internal pressure has been described to be monitored by the manometer 403, suction pumps (not shown) may be connected to the other ends of the pipes 402 to monitor absolute pressure using the manometer 403.

Figure 19:
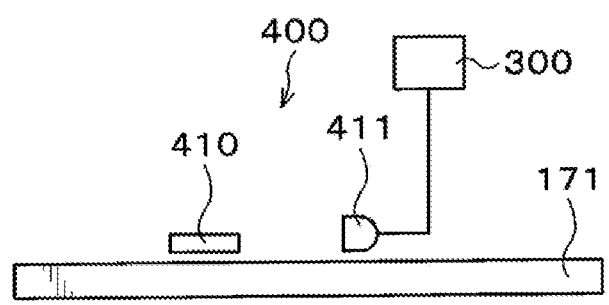
FIG. 19 is a longitudinal sectional schematically showing a configuration of a monitoring unit which monitors holes being clogged in a porous portion according to another embodiment.

Next, another example of the monitoring unit 400 will be described. As shown in FIG. 19, the monitoring unit 400 includes a block 410 and a sensor 411 as a detection unit configured to detect a gap between the block 410 and the porous portion 171. In the maintenance of the peeling system 1, the block 410 is positioned above the porous portion 171, and the gap between the porous portion 171 and the block 410 is measured by the sensor 411. A measurement of the sensor 411 is sent to the control unit 300. When the measurement is smaller than a predetermined value, it is determined that clogging of hole is generated and cleaning the porous portion 171 is initiated.

Figure 20:
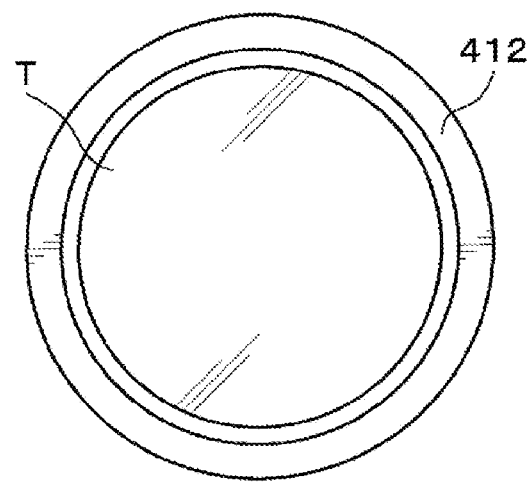
FIG. 20 is a plane view schematically showing a configuration of a gas supply member.
Figure 21:
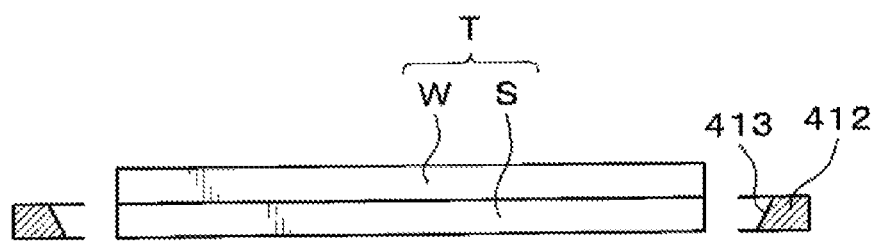
FIG. 21 is a longitudinal sectional view schematically showing a configuration of the gas supply member.

In some embodiments, as shown in FIGS. 20 and 21, a gas supply member 412 may be further provided as an inert gas supply unit in addition to the porous portion 171. The gas supply member 412 is placed at a position facing the periphery of the overlapped wafer T (the support wafer S). In this embodiment, the gas supply member 412 is formed in a circular ring shape (ring). A surface 413 facing the overlapped wafer T (the support wafer S) in the gas supply member 412 is formed of porous. Through the surface 413, the inert gas is supplied toward the overlapped wafer T (the support wafer S). In addition, the gas supply member 412 is provided above the second holding unit 111 moved by the moving mechanism 150 and along the peripheral portion of the support wafer S. Further, when the first holding unit 110 is moved by the moving mechanism 150, the gas supply member 412 is provided above the first holding unit 110 and along the peripheral portion of the wafer to be processed W.

Figure 22:
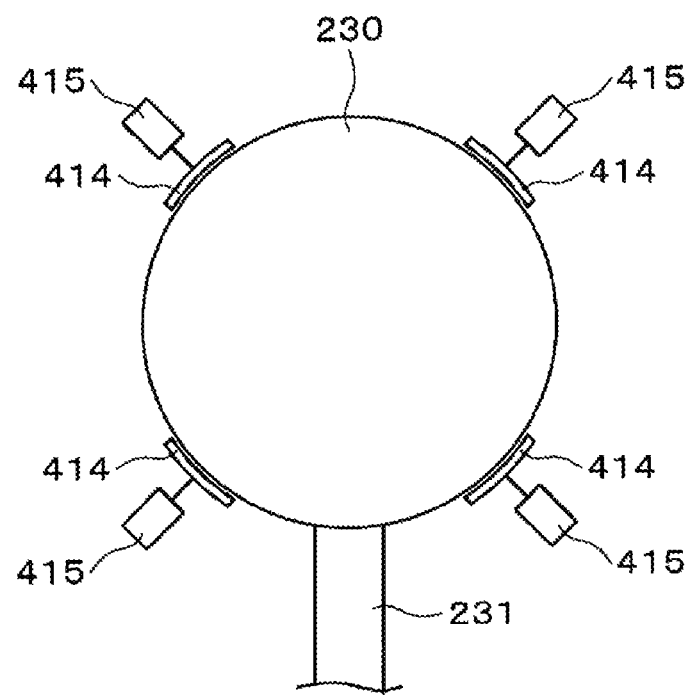
FIG. 22 is a plane view schematically showing a configuration of a Bernoulli chuck according to another embodiment.

In some embodiments, as shown in FIG. 22, as another example of the Bernoulli chuck 230, a plurality of holding guides 414 configured to hold the periphery of the wafer to be processed W may be provided in the periphery of the Bernoulli chuck 230. This configuration prevents the wafer to be processed W held by the Bernoulli chuck 230 from being dislocated. In some embodiments, a plurality of guide moving units 415 may be further provided to allow the respective holding guides 414 to approach the wafer to be processed W or be spaced apart therefrom.

Furthermore, some portions of the above embodiments may be combined with each other, while obtaining the same operation and effects as the above embodiments.

While in the above embodiments, the wafer to be processed W has been described to be subjected to the post-treatment in the post-treatment station 4 for the product, the present disclosure is not limited thereto. For example, the present disclosure may be applied when a wafer to be processed used in, e.g., three-dimensional integration technique, is peeled off from a support wafer. The three-dimensional integration technique is a technique to meet a recent demand for high density integration of semiconductor devices, in which a plurality of highly-integrated semiconductor devices are stacked in three dimensions, instead of placing the plurality of semiconductor devices on a horizontal plane. Even in this three-dimensional integration technique, there is a desire to stack thin the wafer to be processed. The thin wafer to be processed is bonded to a support wafer and subsequently, a predetermined process is performed onto the bonded wafers.

While, in the above embodiments, the inert gas supply mechanism 170 has been described to supply the inert gas onto the bonding surface $W_J$ of the wafer to be processed W exposed when the overlapped wafer T is peeled off, the use of the inert gas supply mechanism 170 is not limited thereto. As an example, in a case where a wafer is subjected to a heat treatment by a heat treatment plate, the inert gas supply mechanism 170 may be disposed in such a manner that a surface of the heated wafer faces the porous portion 171, thus preventing oxidation from being generated during the heat treatment without having to use an airtight container.

Although preferable embodiments of the present disclosure have been described above with reference to the accompanying drawings, the present disclosure is not limited to the embodiments. It should be understood that various changes and modifications are readily apparent to those skilled in the art within the scope of the spirit as set forth in the claims, and those should also be covered by the technical scope of the present disclosure. The present disclosure is not limited to the embodiments but can take various aspects. The present disclosure may be applied to other various substrates including an FPD (flat panel display), a mask reticle for a photomask and so on, in addition to the wafers.

According to the present disclosure, it is possible to efficiently prevent a rapid oxidation from being generated on a bonding surface between a substrate to be processed and a support substrate when the substrates are peeled off from each other by a heating treatment.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A peeling device for peeling off a substrate to be processed and a support substrate from an overlapped substrate, the overlapped substrate being formed by bonding the substrate to be processed and the support substrate by an adhesive, the peeling device comprising:
   a first holding unit provided with a heating mechanism to heat the substrate to be processed and configured to hold the substrate to be processed in a horizontal direction;
   a second holding unit provided with a heating mechanism to heat the support substrate and configured to hold the support substrate in a horizontal direction;
   a moving mechanism configured to move at least one of the first holding unit and the second holding unit relative to each other in a horizontal direction; and
   an inert gas supply mechanism configured to supply an inert gas onto a bonding surface of the substrate to be processed or a bonding surface of the support substrate,
   wherein the inert gas supply mechanism includes a porous portion with a plurality of holes formed in the porous portion and a gas supply pipe connected to the porous portion to supply the inert gas to the porous portion,
   wherein the porous portion is provided to be vertically spaced apart from the bonding surface of the substrate to be processed by a predetermined distance, and
   wherein an end portion of the porous portion in a moving direction of the porous portion is formed in a concave shape in conformity to a shape of the substrate to be processed as viewed from the top.

2. The peeling device of claim 1, wherein the porous portion is formed in a flat plate shape enough to cover the substrate to be processed as viewed from the top.

3. The peeling device of claim 1, wherein the concave portion of the porous portion is brought into contact with the substrate to be processed as viewed from the top.

4. The peeling device of claim 1, wherein the moving mechanism moves the porous portion together with the second holding unit in the horizontal direction.

5. The peeling device of claim 1, wherein the gas supply pipe is connected to the porous portion via a dispersion plate which is configured to cover one surface of the porous portion,
wherein a gas channel is formed inside the dispersion plate, the gas channel being in communication with the porous portion and the gas supply pipe.

6. The peeling device of claim 1, wherein a vertical distance between the porous portion and the substrate to be processed falls within a range of 0.5 mm to 4 mm.

7. The peeling device of claim 1, wherein the inert gas supplied from the inert gas supply mechanism is ionized by an ionizer.

8. The peeling device of claim 1, wherein the inert gas supply mechanism is configured to supply the inert gas to the bonding surface of the support substrate and the bonding surface of the substrate to be processed, and
wherein the porous portion is disposed to be vertically spaced apart from the bonding surface of the support substrate by a predetermined distance.

9. A peeling system for peeling off a substrate to be processed and a support substrate from an overlapped substrate, the overlapped substrate being formed by bonding the substrate to be processed and the support substrate by an adhesive, the peeling system comprising:
a peeling process station configured to perform a predetermined process on the substrate to be processed, the support substrate and the overlapped substrate;
a carry-in/carry-out station configured to carry the substrate to be processed, the support substrate or the overlapped substrate in and out of the peeling process station; and
a transfer station configured to transfer the substrate to be processed, the support substrate or the overlapped substrate between the peeling process station and the carry-in/carry-out station,
wherein the peeling process station includes:
a peeling device configured to peel off the substrate to be processed and the support substrate from the overlapped substrate; and
a first cleaning device configured to clean the substrate to be processed which is peeled by the peeling device;
a second cleaning device configured to clean the support substrate which is peeled by the peeling device;
wherein the peeling device includes:
a first holding unit provided with a heating mechanism to heat the substrate to be processed and configured to hold the substrate to be processed in a horizontal orientation;
a second holding unit provided with a heating mechanism to heat the support substrate and configured to hold the support substrate in a horizontal direction;
a moving mechanism configured to move at least one of the first holding unit and the second holding unit relative to each other in a horizontal direction; and
an inert gas supply mechanism configured to supply an inert gas onto a bonding surface of the substrate to be processed which is exposed by moving the first holding unit and the second holding unit relative to each other in the horizontal direction by the moving mechanism,
wherein the inert gas supply mechanism includes a porous portion with a plurality of holes formed in the porous portion and a gas supply pipe connected to the porous portion to supply the inert gas to the porous portion, and
wherein the porous portion is provided to be vertically spaced apart from the bonding surface of the substrate to be processed by a predetermined distance.

10. The peeling system of claim 9, wherein the porous portion is formed in a flat plate shape enough to cover the substrate to be processed as viewed from the top.

11. The peeling system of claim 9, wherein an end portion of the porous portion in a moving direction of the porous portion is formed in a concave shape in conformity to a shape of the substrate to be processed as viewed from the top.

12. The peeling system of claim 11, wherein the concave portion of the porous portion is brought into contact with the substrate to be processed as viewed from the top.

13. The peeling system of claim 9, wherein the moving mechanism moves the porous portion together with the second holding unit in the horizontal direction.

14. The peeling system of claim 9, wherein the gas supply pipe is connected to the porous portion via a dispersion plate which is configured to cover one surface of the porous portion, and
wherein a gas channel is formed inside the dispersion plate, the gas channel being in communication with the porous portion and the gas supply pipe.

15. A method for peeling off a substrate to be processed and a support substrate from an overlapped substrate using a peeling device, the overlapped substrate being formed by bonding the substrate to be processed and the support substrate by an adhesive,
wherein the peeling device includes:
a first holding unit provided with a heating mechanism to heat the substrate to be processed and configured to hold the substrate to be processed in a horizontal direction;
a second holding unit provided with a heating mechanism to heat the support substrate and configured to hold the support substrate in a horizontal direction;
a moving mechanism configured to move at least one of the first holding unit and the second holding unit relative to each other in a horizontal direction; and
an inert gas supply mechanism configured to supply an inert gas onto the substrate to be processed,
wherein the inert gas supply mechanism includes a porous portion with a plurality of holes formed in the porous portion and a gas supply pipe connected to the porous portion to supply the inert gas to the porous portion,
wherein the porous portion is provided to be vertically spaced apart from a bonding surface of the substrate to be processed by a predetermined distance,
the method comprising:
peeling off the substrate to be processed and the support substrate from the overlapped substrate by moving the first holding unit and the second holding unit relative to each other in the horizontal direction while heating the substrate to be processed held by the first holding unit and the support substrate held by the second holding unit; and
spacing the porous portion apart from a bonding surface of the substrate to be processed by a predetermined distance in a vertical direction, and supplying the inert gas from the porous portion to the bonding surface of the substrate to be processed exposed by the peeling, wherein the porous portion is formed in a flat plate shape enough to cover the substrate to be processed as viewed from the top, wherein an end portion of the porous portion in a moving direction of the porous portion is formed in a concave shape in conformity to a shape of the substrate to be processed as viewed from the top, wherein the porous portion is disposed to be brought the concave portion thereof into contact with the substrate to be processed as viewed from the top, and wherein the supply of the inert gas is initiated at least before the bonding surface of the substrate to be processed is exposed by the peeling.

16. The method of claim 15, wherein the supply of the inert gas continues until the substrate to be processed has a predetermined temperature or less.

17. The method of claim 15, wherein the inert gas supply mechanism is configured to supply the inert gas onto a bonding surface of the support substrate exposed by the peeling, instead of the bonding surface of the substrate to be processed exposed by the peeling, and wherein the supply of the inert gas is performed in a state where the porous portion is spaced apart from the bonding surface of the support substrate by a predetermined distance in the vertical direction.

\* \* \* \* \*